United States Patent
Ho et al.

(10) Patent No.: US 6,275,177 B1
(45) Date of Patent: Aug. 14, 2001

(54) SIGMA-DELTA MODULATOR USING A LOCAL NONLINEAR FEEDBACK LOOP TECHNIQUE

(75) Inventors: Chian C. Ho, Taipei; Hsun-Chang Hsieh, Hsinchu; Chung J. Kuo, Chiai, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/442,335

(22) Filed: Nov. 17, 1999

(30) Foreign Application Priority Data

May 20, 1999 (TW) ................................................ 88108250

(51) Int. Cl.$^7$ ................................................... H03M 3/00
(52) U.S. Cl. .......................................................... 341/143
(58) Field of Search .................................... 341/143, 144, 341/118, 120, 155

(56) References Cited

U.S. PATENT DOCUMENTS 5,982,317 * 11/1999 Steensgaard ........................ 341/143
6,150,969 * 11/2000 Melanson ............................. 341/143

OTHER PUBLICATIONS

S. Mohsen Moussavi et al, IEEE Transactions on Circuits and Systems–II: Analog and Digital Signal Processing, vol. 41. No. 1, Jan. 1994, pp. 19–25.

David B. Ribner et al, IEEE Journal of Solid–State Circuits, vol. 26. No. 12, Dec. 1991, pp. 1764–1774.
David B. Ribner, IEEE Transactions on Circuits and Systems, vol. 38, No. 2, Feb. 1991, pp.145–159.
Stephen Au et al, IEEE 1996 Custom Integrated Circuits Conference, pp. 411–414.
Zhong–Yuan Chang et al, IEEE Journal of Solid–State Circuits, vol. 30, No. 12, Dec. 1995, pp. 1449–1456.
Peicheng Ju et al, IEEE Journal of Solid–State Circuits, vol. 30, No. 12, Dec. 1995, pp.1316–1325.
Victor Da Fonte Dias, "Sigma–Delta Signal Processing", Instituto Superior Tecnico, Seccao de Electronica, pp. 421–424, (No date given).
Yasuyuki Matsuya et al, IEEE Journal of Solid–State circuits, vol. 24, No. 4, Aug. 1989, pp. 969–975.

* cited by examiner

*Primary Examiner*—Brian Young
(74) *Attorney, Agent, or Firm*—Birch, Stewart, Kolasch & Birch, LLP

(57) ABSTRACT

A local nonlinear feedback loop (LNFL) technique and a sigma-delta modulator (SDM) for promoting highly stable oversampling using the LNFL technique. Not only can gain mismatch of the sigma-delta modulator be minimized, but the overload of the later stage sigma-delta modulator can also be resolved without sacrificing the signal noise ratios (SNR) of the overall system. Moreover, using the local nonlinear feedback loop technique of this invention attenuates the voltage signal of the sigma-delta modulator, therefore decreasing the power consumption of the overall sigma-delta modulator system.

40 Claims, 14 Drawing Sheets

Input signal of the second-stage modulation unit

SOFOC

Output signal int2 of the integrator in the second-stage modulation unit

SOFOC

Input signal of the second-stage modulation unit

SOFOC by LNFL

Output signal int2 of the integrator in the second-stage modulation unit

SOFOC by LNFL

Input signal of the second-stage modulation unit

SOFOC by LNFL

Output signal int2 of the integrator in the second-stage modulation unit

SOFOC by LNFL

Input signal of the second-stage modulation unit

SOFOC by multi-bit quantization

Output signal int2 of the integrator in the second-stage modulation unit

SOFOC by multi-bit quantization

SIGMA-DELTA MODULATOR USING A LOCAL NONLINEAR FEEDBACK LOOP TECHNIQUE

BACKGROUND OF THE INVENTION

1. Field of the Invention

This invention relates to a sigma-delta modulator (SDM), particularly to a highly stabilized sigma-delta modulator using a LNFL (Local Nonlinear Feedback Loop) technique for resolving overload problems.

2. Description of the Related Art

A variety of sigma-delta modulators (SDMs), such as a so-called oversampled SDM, are used for fabricating analog-to-digital converters (ADC). The ADC comprising an oversampled SDM mainly employs oversampling and noise shaping techniques of the SDM for reducing quantization noise and shaping it to a higher frequency. Then the high frequency noise is filtered out with a decimator and a digital lowpass filter to enhance the signal-to-noise ratio (SNR) and to obtain high resolution. Further, the SDM has the following advantages: simple construction, no need for an additional trimming circuit, and high tolerance of variation in circuit components. Consequently, the SDM is used widely in situations where SNR needs to be enhanced.

The architecture of SDMs falls into two categories: classical and cascaded SDMs.

FIGS. 1A–1C illustrate the architecture of a classical SDM. In the Figures, the order of the noise shaping factor of the SDM is determined by the number of the cascaded integrators in the SDM. FIG. 1A illustrates a one-ordered SDM with an integrator $Z^{-1}$ 10; FIG. 1B illustrates a two-ordered SDM with two integrators 11 and 12 connected in serial; and FIG. 1C illustrates a multi-ordered (at least three orders) SDM with plural integrators 13, 14, and 15.

Though the integrator with high-order noise shaping function can provide a higher resolution, the SDM becomes unstable when the number of integrators (orders) exceeds two. This is due to signal overload accumulated in the integrator in the later stage.

The architecture of the cascaded SDM realizes high-ordered noise shaping with multiple low-ordered SDMs. Multi-stage noise shaping (MASH) architecture of this type is shown in FIGS. 2A–2B. In FIG. 2A, high-ordered noise shaping is realized with two cascaded low-ordered SDMs 20 and 21; whereas in FIG. 2B, high-ordered noise shaping is realized with three cascaded low-ordered SDMs 22, 23, and 24. However, cascaded SDMs are still troubled with overloads.

The output SNR will degrade due to restraints imposed by non-ideal conditions (values) of the analog components. This is due to the gain mismatch effect of the cascaded SDM. An alternative solution is to provide an improved cascaded SDM, that is, the second-ordered SDM cascaded by a first-ordered SDM (Second-Ordered First-Ordered Cascaded architecture; SOFOC), as shown in FIG. 3.

The architecture shown in FIG. 3 basically converts a MASH architecture cascaded with three-stage first ordered SDMs 22, 23, and 24 as shown in FIG. 2B, into a MASH architecture having second-ordered SDM 30 in the preceding stage and a first-ordered SDM 32 in the succeeding stage to realize a cascaded SDM. The input of the SDM of the stage 32 receives a quantization noise $-Q_1$ of the SDM of the preceding stage 30. The conversion function is as follows:

$$Y_1 = X + (1-Z^{-1})^2 Q_1$$
$$Y_2 = -Q_1 + (1-Z^{-1}) Q_2$$
$$Y = Y_1 + (1-Z^{-1})^2 Y_2 = X + (1-Z^{-1})^3 Q_2$$

where $Y_1$ is a first-stage digital output, and $Y_2$ is a second-stage digital output; $-Q_1$ is a first-stage quantization noise, $-Q_2$ (not shown in FIG. 3) is a second-stage quantization noise, Y is an overall digital output signal, and X is an analog input signal.

Refer to FIG. 2B for a comparison with the MASH architecture. When the quantization noise of the preceding stage cannot be fully eliminated due to a gain mismatch effect, the overall digital output signal of the MASH architecture is as follows:

$$Y(MASH) = \alpha Y_1 + \beta(1-Z^{-1})Y_2 + \gamma(1-Z^{-1})^2 Y_3$$
$$= \alpha X + \underline{(\alpha-\beta)(1-Z^{-1})Q_1 + (\beta-\gamma)(1-Z^{-1})^2 Q_2 +}$$
$$\underline{\gamma(1-Z^{-1})^3 Q_3}$$

where $Y_3$ is a third-stage digital output, and $-Q_3$ is a third-stage quantization noise; and $\alpha \neq \beta \neq \gamma$ due to gain mismatch, whereas $\alpha = \beta = \gamma$ when the gains of the preceding and succeeding stages match.

In the SOFOC architecture, when the quantization noise of the preceding stage cannot be fully eliminated due to gain mismatch effect, the overall digital output signal of the SOFOC architecture is as follows:

$$Y(SOFOC) = \alpha Y_1 + \beta(1-Z^{-1})^2 Y_2$$
$$= \alpha X + \underline{(\alpha-\beta)(1-Z^{-1})^2 Q_1 + \beta(1-Z^{-1})^3 Q_2}$$

If in gain match, then $\alpha = \alpha = \gamma$; and assume $\alpha = 1$, then Y(SOFOC)=Y, being the optimal status for analog components. Under the gain mismatch effect, after the processing of the second-order noise shaping factor, that is, $(1-Z^{-1})^2$, the leaking noise generated in an SOFOC architecture becomes smaller than the first-order leaking noise generated in a MASH architecture. Therefore, the SDM in the SOFOC architecture demonstrates better resistance to the sensitivity (gain mismatch) of analog components. That is to say, the performance of the SDM in the SOFOC has lower dependency upon the idealization of analog components.

However, since the preceding stage of an SOFOC SDM is a second-ordered SDM rather than a highly stable first-ordered SDM, and the input of the succeeding stage of the SDM is the quantized noise of the preceding stage of the SDM, the cascaded second stage integrator still suffer from overload due to significant input signals.

It is known from the above that an oversampled SDM, both of a classical and cascaded architecture, is subject to instability. Therefore, it becomes essential to enhance the stabilization of the oversampled SDM.

The following three techniques have been proposed to resolve overload problems: (1) limiting an input dynamic range; (2) inserting a gain scaling means into an SDM, for reducing linear-proportionally of the dynamic range of the system signal as shown in FIG. 4; and (3) using automatic gain control (AGC), for linear-proportionally adjusting of the dynamic range of the system signal with the input signal magnitude.

The aforementioned three conventional techniques all linearly reduce the operating signal swing range of the modulators to protect the integrator from instability due to significant signal accumulation. But a limiting input dynamic range technique will limit the applicable range of the modulator; whereas the AGC technique or gain scaling insertion technique will reduce the overall system SNR, because the output end of the system has to compensate the previous gain scaling (or signal reduction).

In the SOFOC architecture of FIG. 4, a signal gain scaling apparatus 40 is further arranged between a second-ordered SDM 30 and a first-order SDM 32 for linearly reducing the amplitude of the error quantization signal $-Q_1$; and a linear gain recovering device 42 is arranged at the output of the first-order SDM 32. The conversion function is represented as:

$$Y_1 = X + (1-Z^{-1})^2 Q_1$$

$$Y_2 = -jQ_1 + (1-Z^{-1}) Q_2$$

$$Y = Y_1 + 1/j \ (1-Z^{-1})^2 \ Y_2 = X + 1/j \ (1-Z^{-1})^3 Q_2$$

where j<1. It is known from the architecture of FIG. 4 that the input signal $-jQ_1$ of the second-stage modulation unit becomes smaller, because of the linear signal scaling apparatus 40, to prevent the second-stage modulation unit from integrator overload. Thus, the quantized noise of the overall output function is compensated by the gain recovering device 42, and is amplified, thus becoming the greater quantized noise $1/j \ (1-Z^{-1})^3 Q_2)$. Therefore, the overall SNR is reduced.

SUMMARY OF THE INVENTION

Accordingly, this invention proposes a local non-linear feedback loop (LNFL) technique to enable high stability of the SDM. This invention adopts SDM by the LNFL architecture to minimize gain mismatch and eliminate overload without reducing overall system SNR. Moreover, the overall system voltage signal scaling can be realized by using the LNFL technique of this invention; therefore, the overall system power consumption of the SDM can be reduced.

To realize the above object, the LNFL technique for SDMs according this invention basically comprises selectively arranging input-signal adjusting devices in front of respective input ends of the various stage integrator modulation units in the SDM, for controlling respectively the magnitude of the input signal of the various stage integrator modulation units. When the input signal of the coupled integrator modulation units is greater than a first specified value, then its corresponding input signal adjustment device will subtract a second specified value from the input signal, then output it to the coupled integrator modulation unit, and further add the second specified value to the output signal of the coupled integrator modulation unit. When the input signal of the coupled integrator modulation units is smaller than the first specified value, then the input signal adjustment device will add the second specified value to the input signal, further output it to the coupled integrator modulation unit, and subtract the second specified value from the output signal of the integrator modulation unit.

Further, to realize a highly stable SDM, this invention provides an SDM by the LNFL comprising: plural modulation units connected in series $S_1-S_n$, for generating plural modulated signals $Y_1-Y_n$ and plural quantized error signals $-Q_1--Q_n$, wherein the input end of the modulation unit $S_1$ is coupled to an analog input signal X, and the input ends of the other modulation units $S_2-S_n$ are coupled to the quantized error signals $-Q_1--Q_{n-1}$, respectively; a level adjustment unit $M_j$ selectively arranged at the input end of the modulation unit $S_{j+1}$, determining whether the addition (or subtraction) of a specified value $\Delta$ will be performed on the quantized error signal $-Q_1$ in accordance with the signal value of the quantized error signal $-Q_j$ of the modulation unit $S_j$, and performing in accordance with the determined result a subtraction (or an addition) of the specified value $\Delta$ from (to) the modulated signal $Y_{j+1}$ of the modulation unit $S_{j+1}$, where $1 \leq j \leq n-1$ and at least one of the level adjustment units is arranged in the SDM; and an adder-synthesizer unit coupled to the plural modulation signals $Y_1-Y_n$ generated by the plural modulation units $S_1-S_n$ for generating an output signal Y of the SDM.

The LNFL technique can also be applied to improve the stability of high-ordered classical SDMs. This invention provides an SDM architecture applicable to classical local non-linear feedback techniques comprising: a modulation unit S for generating a modulation signal Y and a quantized error signal $-Q$, respectively; a level adjustment unit M for receiving an analog input signal X, determining whether to perform an addition to (or a subtraction from) the signal X of a specified amount $\Delta$ in accordance with the magnitude of the analog input signal X, for limiting the range of the analog input signal X and outputting the result to the modulation unit S; and a synthesis operator for receiving the signal Y and a compensation signal to obtain an output signal Y' for the SDM. Therein, the compensation signal is outputted by the level adjustment unit M, the signal amplitude is the same as the specified amount $\Delta$.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The aforementioned objects, features and advantages of this invention will become apparent by referring to the following detailed description of a preferred embodiment with reference to the accompanying drawings, wherein.

DETAILED DESCRIPTION OF THE PREFERRED EMBODIMENT

For convenience and simplicity, the LNFL technique for improving stability is described as applied to SOFOC architecture only. However, the technique could be applied to other architectures, for example architectures having various order levels less than or greater than the SOFOC architecture disclosed herein. In the following, refer to FIG. 5, a diagram illustrating an architecture of the SOFOC by the LNFL.

First, referring to FIG. 5, the principle of SOFOC by the LNFL is briefly described as follows.

In a cascaded (or conventional) SDM, a level adjustment device (VADJ), in front of the input end of the second-stage modulation device $S_2$, is used for controlling the magnitude of the input signal.

When the output $-Q_1$ of the first-stage modulation unit $S_1$ is greater than ½, the output of the level adjustment device is $-Q_1-\Delta$; then the digital quantity of $+\Delta$ is added to the output of the second-stage modulation unit $S_2$. When the output $-Q_1$ of the first-stage modulation unit $S_1$ is smaller than ½, the output of the level adjustment device is $-Q_1+\Delta$; then the digital quantity of $-\Delta$ is added to the output of the second-stage modulation unit $S_2$ Where the specific value of $\Delta$ equals the analog quantity corresponding to the value of one bit level of a digital value.

In accordance with the aforementioned principle, the dynamic range of the input signal of the second-stage modulation unit $S_2$ is adjusted to a range within $|½|$, so the overload of integrators of the second-stage modulation unit can be prevented. Likewise, if the level adjustment device VADJ is added in front of various stage modulation units, then the overload of integrators of the various stage modulation units can be prevented, thus, effectively maintain the stability of the SDM.

Figure 5:
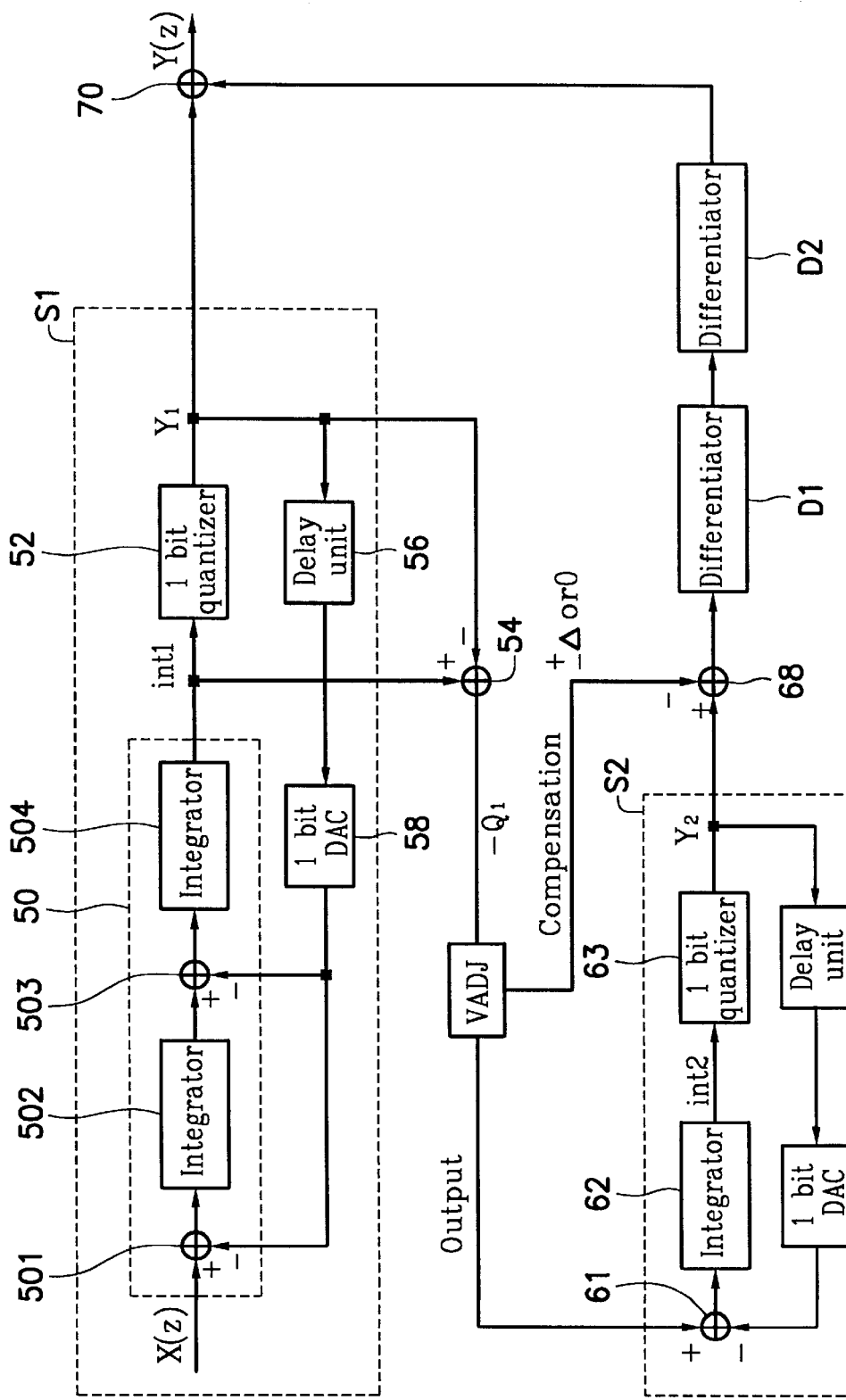
FIG. 5 illustrates an SOFOC by the LNFL architecture.

Referring to FIG. 5, a highly stable SDM improved with the application of the LNFL technique of this embodiment comprises the following units: two modulation units $S_1$–$S_2$ connected in series, for generating plural modulation signals $Y_1$ to $Y_2$ and two quantized error signals $-Q_1$ and $-Q_2$; a level adjustment device VADJ, arranged between the modulation units $S_1$ and $S_2$, for adjusting the dynamic range of the quantized error signal $-Q_1$ and outputting a compensative signal (quantity); where the input end of the modulation units $S_1$ is coupled to the input of an analog signal X, and the input end of the modulation units $S_2$ is coupled to the quantized error signal $-Q_1$ through the level adjustment device VADJ; and an adder-synthesizer unit 70, wherein the modulation signal $Y_2$ generated by the modulation unit $S_2$ and the compensative signal $\pm\Delta$ or 0 are accumulated through the adder 68, and then outputted to the adder-synthesizer unit 70 after being processed by the two-stage differentiators D1 and D2, and then synthesized into a sigma-delta modulation output signal Y with the modulated signal $Y_1$ generated by the modulation unit $S_1$.

The modulation unit $S_1$ includes a second-order integration module 50 formed with two integration units, each of the integration units having a synthesizer (adder 501 or 503) connected in series with an integrator 502 or 503; a one-bit quantizer 52 for coupling the output signal int1 of the two-stage integration module to quantize the signal int1 and obtain the modulated signal $Y_1$; a synthesis operator 54 for obtaining the difference between the output signal int1 of the second-order SDM and the modulated signal $Y_1$ as the quantized error signal $-Q_1(=int1-Y_1)$; and a delay unit 56 connected in serial to a one-bit digital-to-analog converter (DAC) 58 for forming a feedback loop path to feed back the modulated signals $Y_1$ to the adders (501 and 503) of the two integrator units 502 and 504, respectively.

The modulation unit $S_2$ includes a synthesizer (adder) 61 connected in serial to an integrator 62 for forming a first-order integration unit; a one-bit quantizer 63 for coupling to the output signal int2 of the first-order integration module for quantizing the signal int2, and then outputting the modulated signal $Y_2$; a synthesis operator (not shown) for obtaining the difference between the output signal int2 of the first-order integration unit and the modulated signal $Y_2$ as the quantized error signal $-Q_2$; and a delay unit 64 connected in serial to a one-bit digital-to-analog converter 65 for forming a respective feedback loop path to feed back the modulated signals $Y_2$ to the synthesizer 61 of the first-order integrator unit.

In the SDM of SOFOC by the LNFL in compliance with the feedback principle, when the quantized error output $-Q_1$ of the first-stage modulation unit $S_1$ is greater than ½, the output of the level adjustment device (VADJ) is $-Q_1-\Delta$, then a digital quantity $+\Delta$ is compensated to the output signal $Y_2$ of the second-stage modulation unit $S_2$; or when the quantized error output $-Q_1$ of the first-stage modulation unit $S_1$ is smaller than ½, the output of the level adjustment device (VADJ) is $-Q_1+\Delta$, then a digital quantity $-\Delta$ is compensated to the output signal $Y_2$ of the second-stage modulation unit $S_2$, and when $-Q_1$ is $(-½) \leq (-Q_1) \leq (+½)$, then the output of the level adjustment device (VADJ) is $-Q_1$; while the quantized output of the second-stage modulation unit $S_2$ remains $Y_2$.

The actual operation of the conversion function is represented as follows:

$$Y_1 = X + (1 - Z^{-1})^2 Q_1$$

$$Y_2 = (-Q_1 \pm \Delta) + (1 - Z^{-1}) Q_2$$

$$Y = Y_1 + (1 - Z^{-1})^2 (Y_2 \mp \Delta)$$

$$= X + (1 - Z^{-1})^2 Q_1 - (1 - Z^{-1})^2 Q_1 \pm (1 - Z^{-1})^2 \Delta +$$
$$(1 - Z^{-1})^3 Q_2 \pm (1 - Z^{-1})^2 \Delta$$

$$= \underline{X + (1 - Z^{-1})^3 Q_2}$$

As can be seen from above, the output conversion function of the SOFOC by the LNFL architecture of this invention remain unaffected, the same as that of conventional SDM in SOFOC architecture.

Figure 1A:
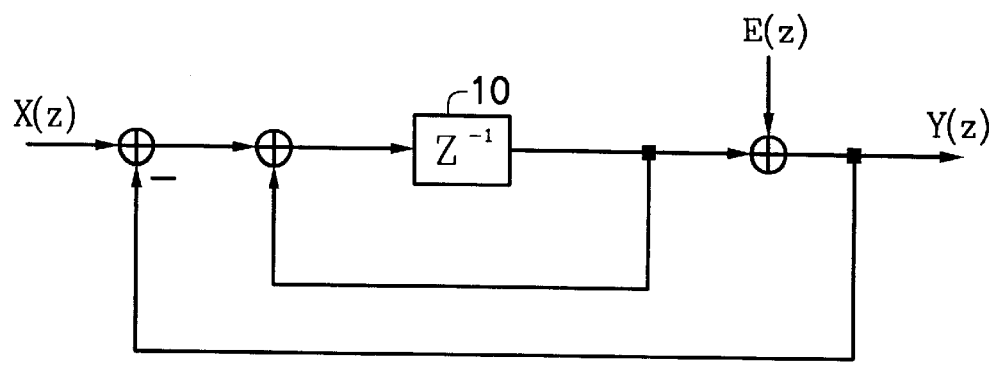
FIGS. 1A–1C illustrate the architecture of a conventional SDM.
Figure 1B:
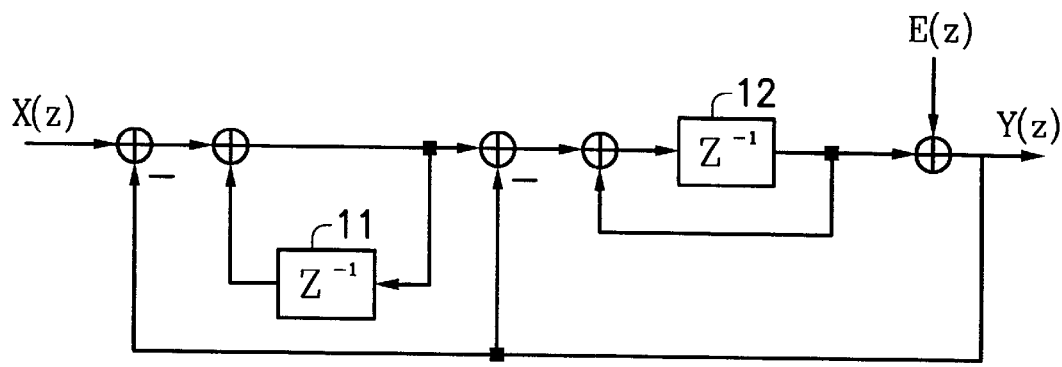
Figure 1C:
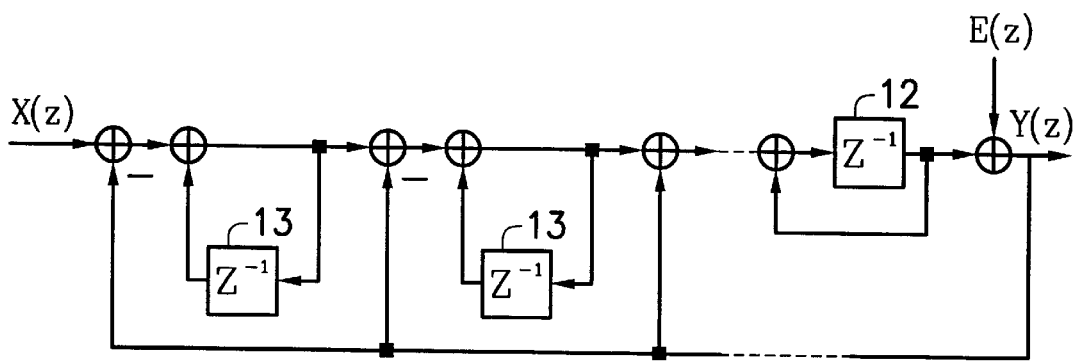
Figure 2A:
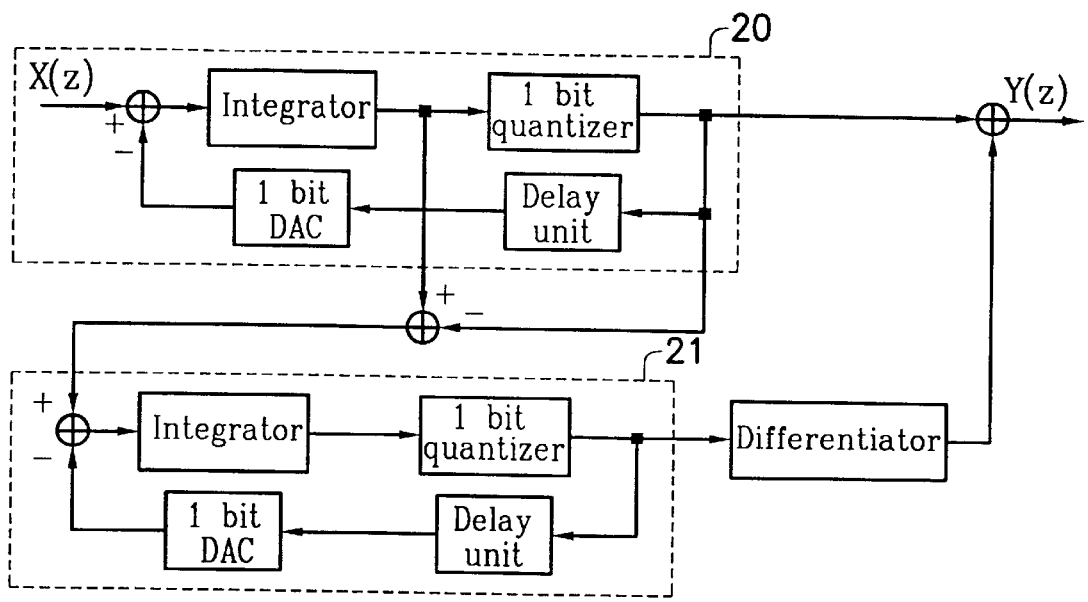
FIGS. 2A–2B illustrate the architecture of a conventional cascaded SDM.
Figure 2B:
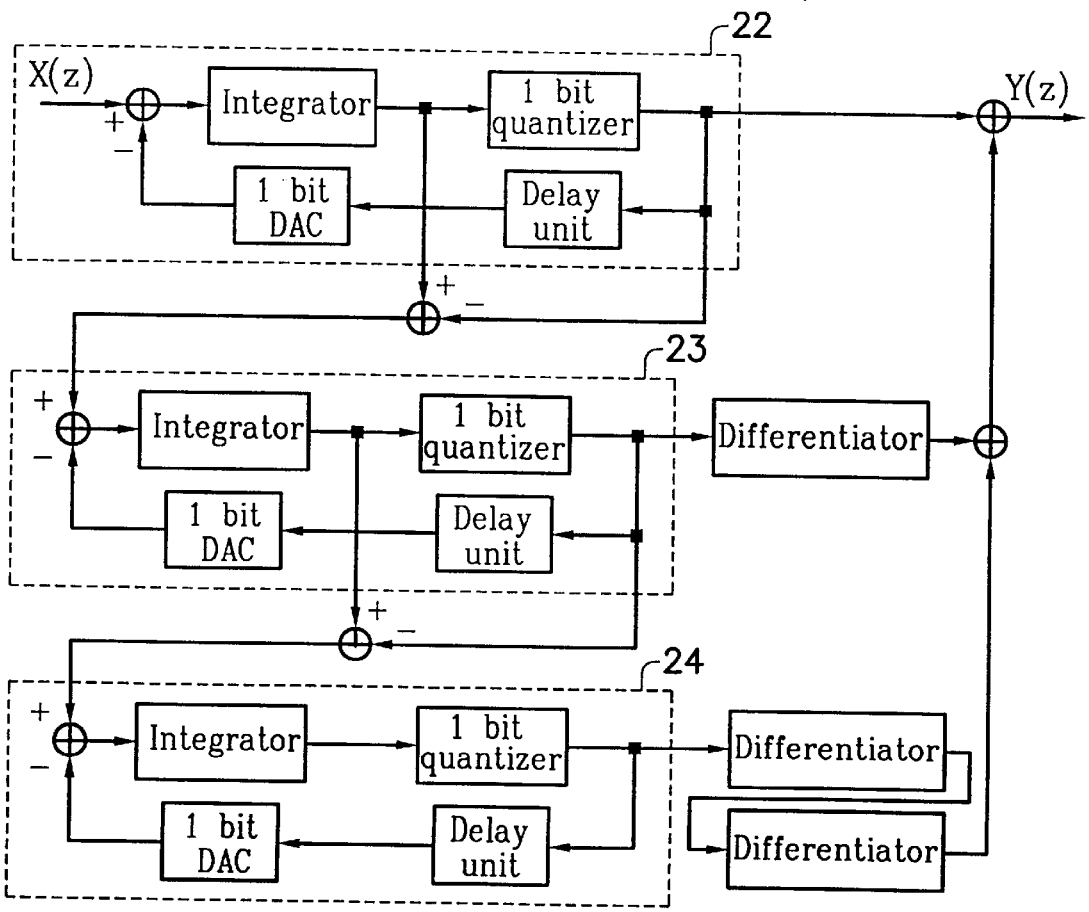
Figure 3:
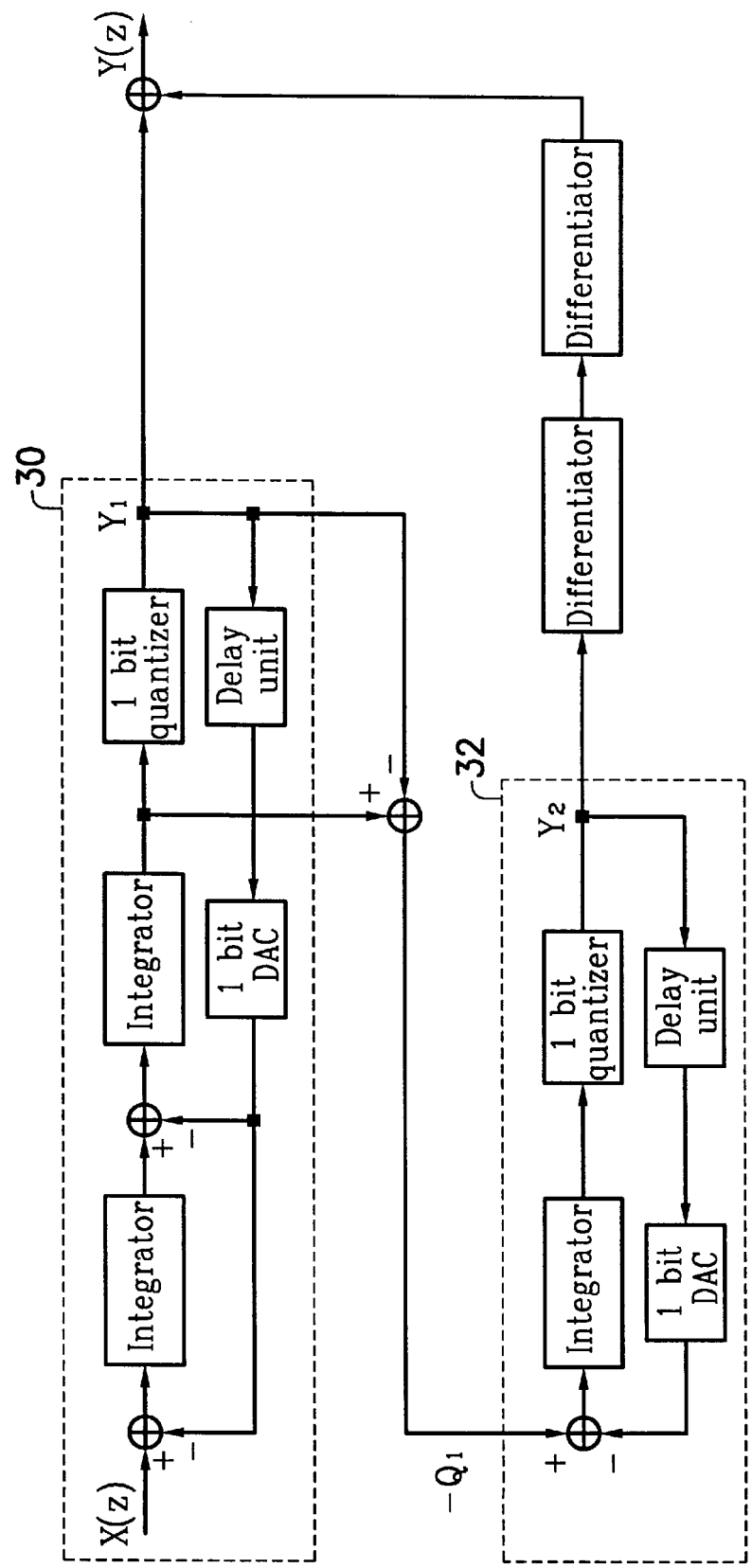
FIG. 3 illustrates a conventional SDM with SOFOC architecture.
Figure 4:
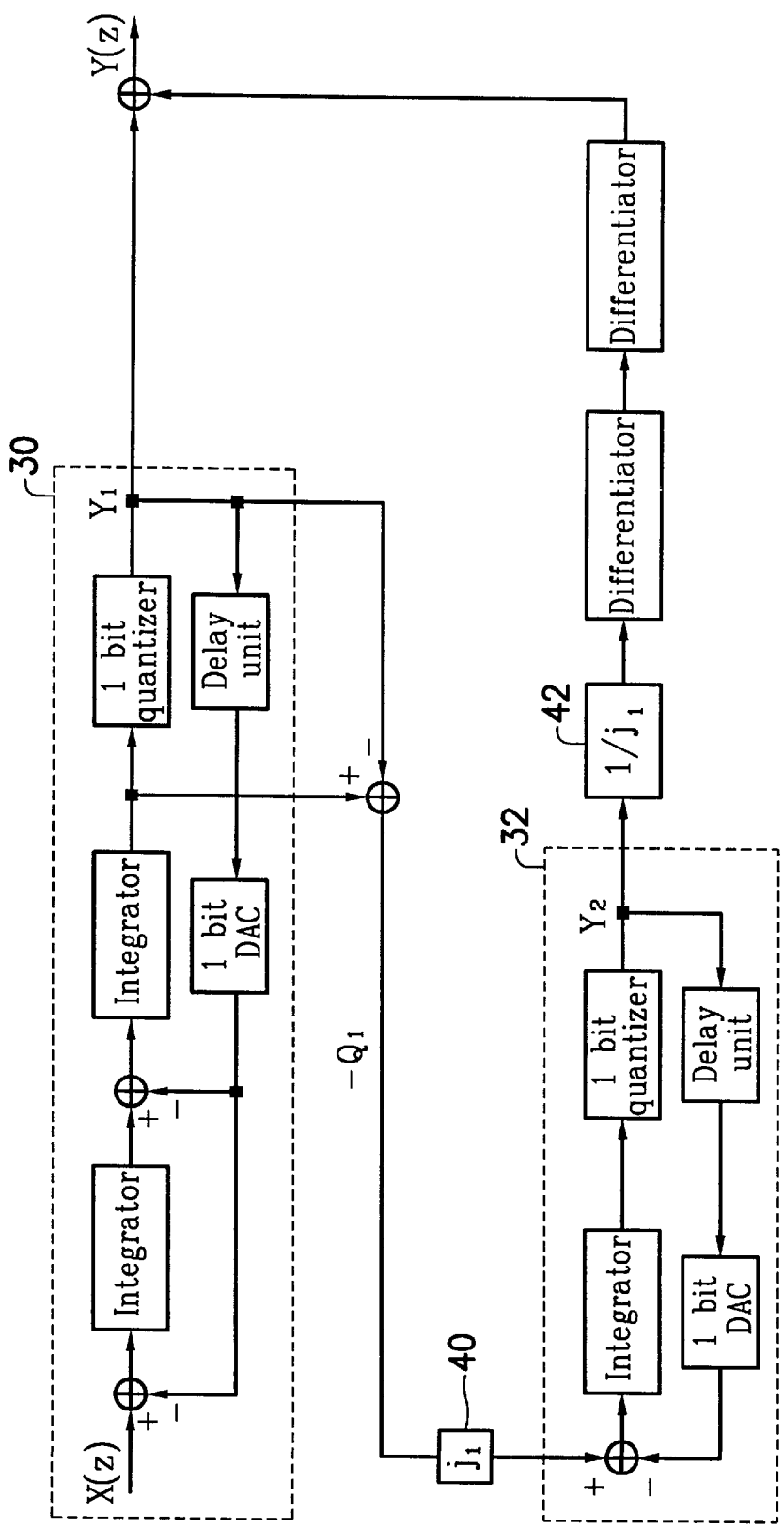
FIG. 4 illustrates an SDM architecture, with signal gain scaling means, for reducing linear-proportionally of the dynamic range of the system signal in a conventional architecture.

FIG. 6 illustrates a comparison of stability between the conventional SOFOC architecture (FIG. 3) and the SOFOC by the LNFL architecture (FIG. 5) of this invention; where (A) and (B) are simulation results of the conventional SOFOC architecture; while (C) and (D) are simulated results of SOFOC by the LNFL.

Figure 6A:
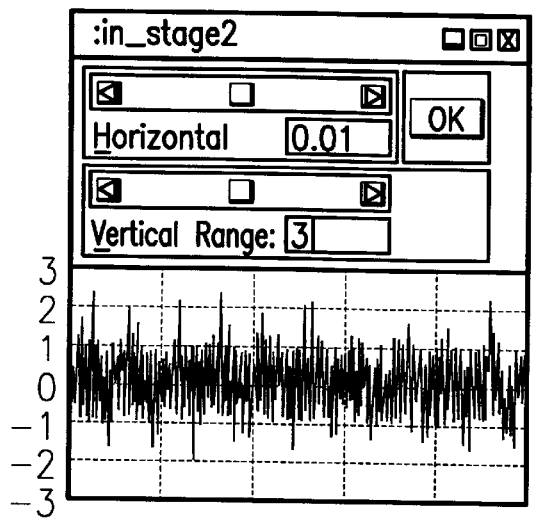
FIGS. 6A–6D illustrate a comparison of stabilization between the conventional SOFOC architecture and the SOFOC by the LNFL architecture of this invention.
Figure 6B:
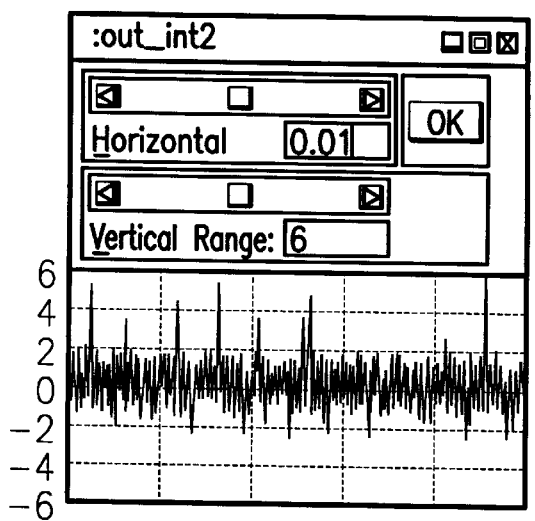
Figure 6C:
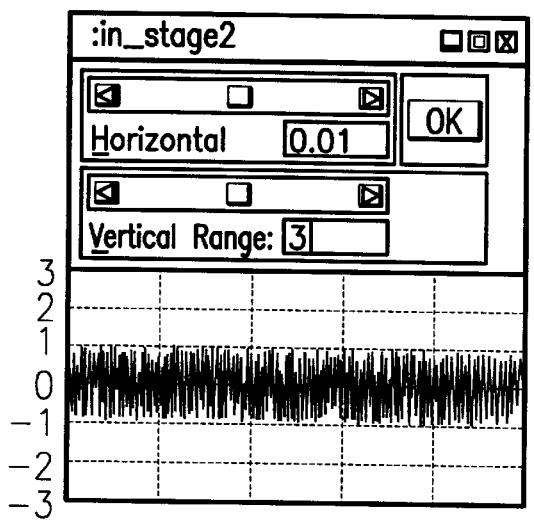

As can be seen from FIGS. 6(A) and 6(C), the SOFOC by the LNFL architecture of this invention restricts the quantized noise ($-Q_1$) inputted to the second-stage modulation unit $S_2$ to a range between $-1$ and $+1$ (in this case $\Delta=2$) using the level adjustment device VADJ, whereas conventional SOFOC architecture does not have such a process.

Figure 6D:
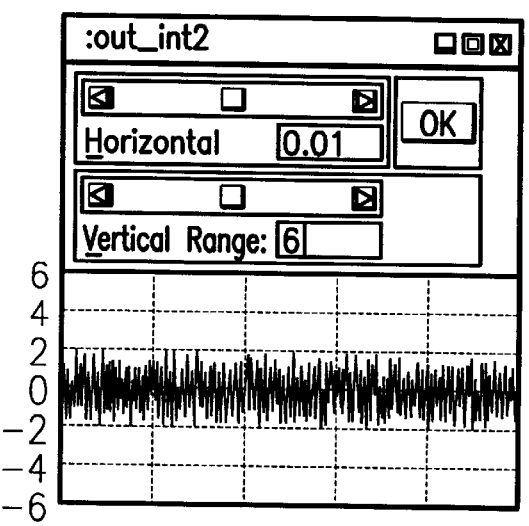

As can be seen from FIGS. 6(B) and 6(D), the second-stage modulation unit 32 of conventional SOFOC architecture demonstrates significantly greater dynamic range than that of the SOFOC by the LNFL architecture of this invention. Therefore, the SOFOC by the LNFL architecture of this invention demonstrates a greater stability than the conventional SOFOC architecture.

Figure 7:
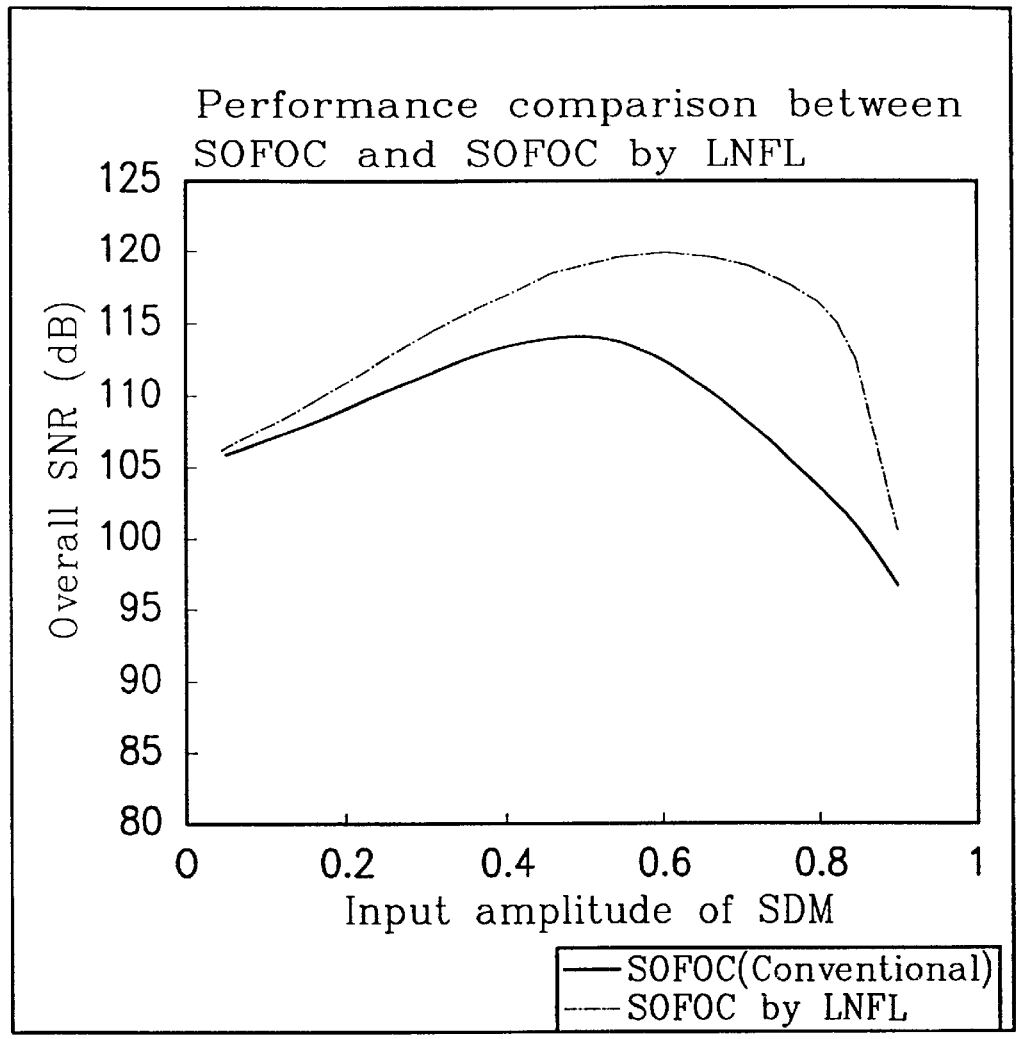
FIG. 7 illustrates a performance chart of the SNR of the conventional SOFOC architecture and the SOFOC by the LNFL architecture of this invention.

FIG. 7 illustrates for a performance chart of the SNR of the conventional SOFOC architecture and the SOFOC by the LNFL architecture of this invention. Evidently, the SOFOC by the LNFL architecture of this invention has better performance than the conventional SOFOC architecture. This is because the transfer function of the SDMs performance is never affected by the nonlinear operation of the LNFL technique, and the quantization noise of the last-stage SDM in SOFOC architecture is further suppressed simultaneously.

Figure 8:
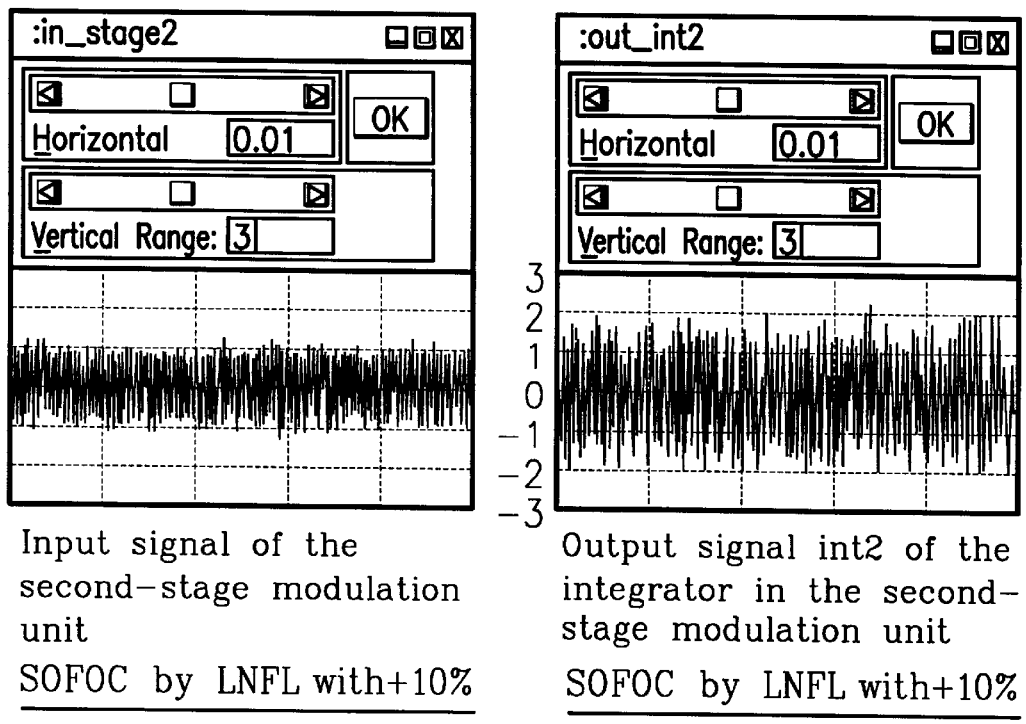
FIG. 8 illustrates a performance chart of the SOFOC by the LNFL architecture of this invention; when the analog components incurred with an inaccuracy (+10% mismatch)
Figure 9:
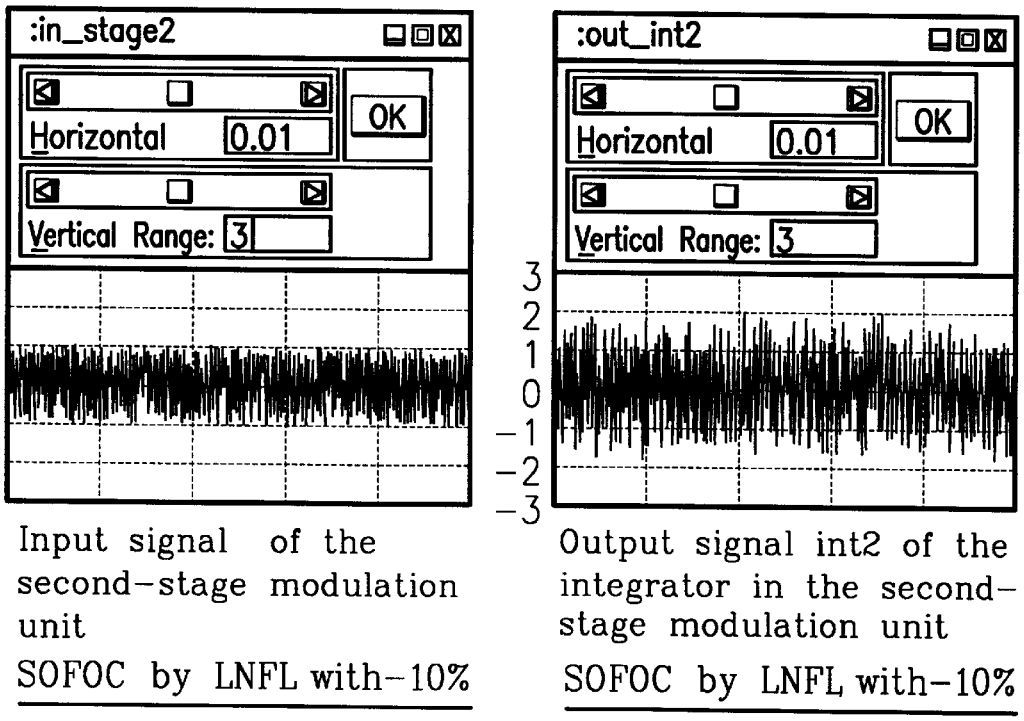
FIG. 9 illustrates a performance chart of the SOFOC by the LNFL architecture of this invention; when the analog components incurred with an inaccuracy (−10% mismatch)

Further, as seen in FIGS. 8 and 9, performance charts of the SOFOC by the LNFL architecture of this invention when the analog components incurred with an inaccuracy (±10% mismatch) are shown. The inaccuracy of the components (such as switches for controlling the signal scaling) in the feedback loop have almost no effect on the stability control of the overall system, since the quantized noise of the second-stage modulation unit is controlled to be within the range between $-2V$ and $+2V$, and the stability and the SNR are not affected. Consequently, the LNFL technique is resistant to errors or disturbance generated from the inaccuracy of the components.

Figure 10:
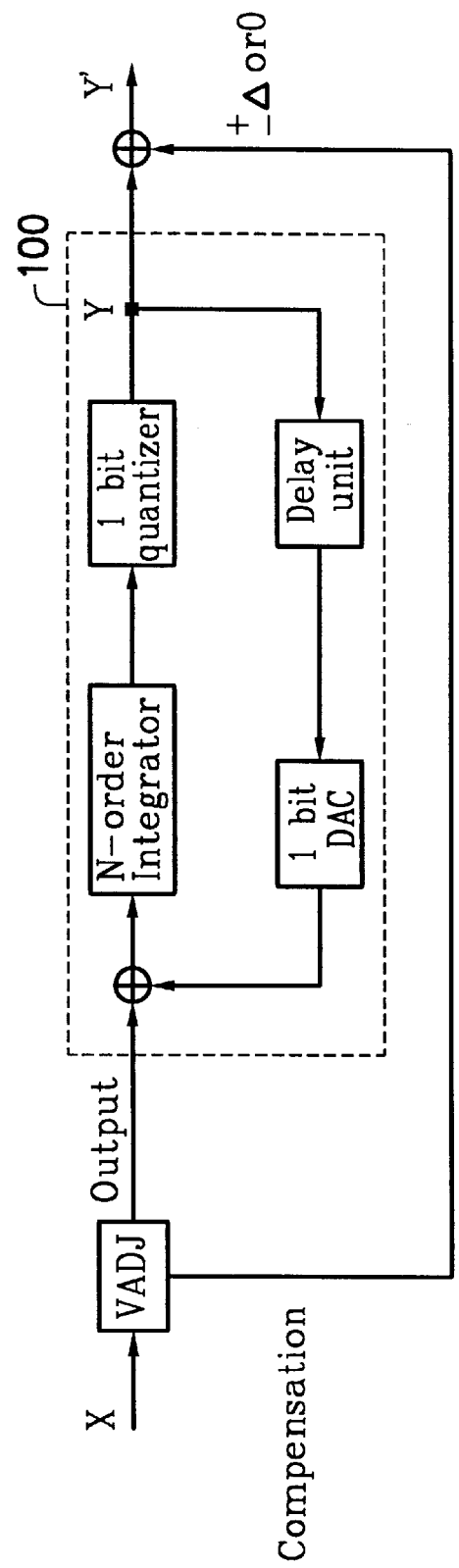
FIG. 10 illustrates the LNFL technique integrated with a conventional SDM.

The LNFL technique can also be applied for improving stability of conventional high-order SDMs; and this invention also provides an LNFL technique applicable to a conventional SDM, as shown in FIG. 10, where a level adjustment device VADJ is added to the input end of the $N^{th}$-order SDM 100 in accordance with the LNFL technique of this invention, for adjusting the magnitude of the input signal X.

When the input signal X is greater (or smaller) than a specific value such as $\frac{\Delta}{2}$, then signal X is subtracted from (or added to) $\Delta$, for inputting $X-\Delta$ (or $X+\Delta$) to the $N^{th}$-order SDM 100; and the compensative amount $+\Delta$ (or $-\Delta$) is added to the output signal Y of the $N^{th}$-order SDM 100 for obtaining the output Y' of the SDM. The conversion function is represented as follows:

$$Y = X + (1 - Z^{-1})^N Q$$
$$Y' = (X - \Delta) + (1 - Z^{-1})^N Q + \Delta$$
$$= X + (1 - Z^{-1})^N Q$$

where $N \geq 1$, and errors due to inaccuracy of components can be prevented without affecting the SNR or resulting in overload of the integrators.

Moreover, in a new architecture applying the local nonlinear feedback loop (LNFL) technique, the signal at the output end is the original quantized output signal plus or minus a compensative amount (digital signal) to form a multi-bit level signal of the SDM. Though the "LNFL" technique of this invention, the "multi-bit quantization" technique of the conventional, and the "internal linear feedback loop" technique of the conventional art is somewhat similar, the relevant factors for the prior art and this invention are considerably different, and the performance of the techniques of the conventional art is not as robust as that of the technique provided with this invention.

Figure 13:
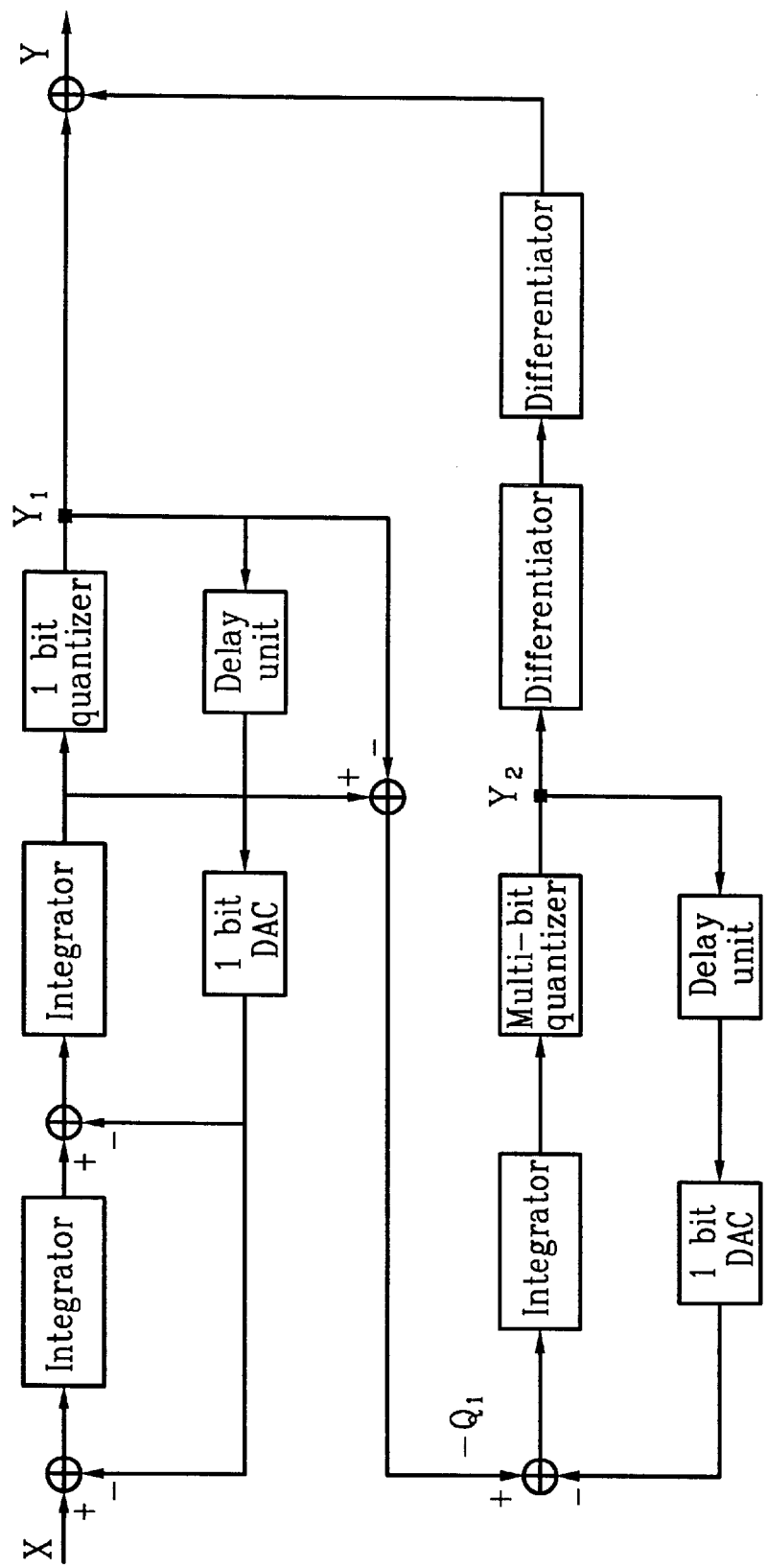
FIG. 13 illustrates the conventional architecture of an SOFOC by "multi-bit quantization operation"
Figure 14:
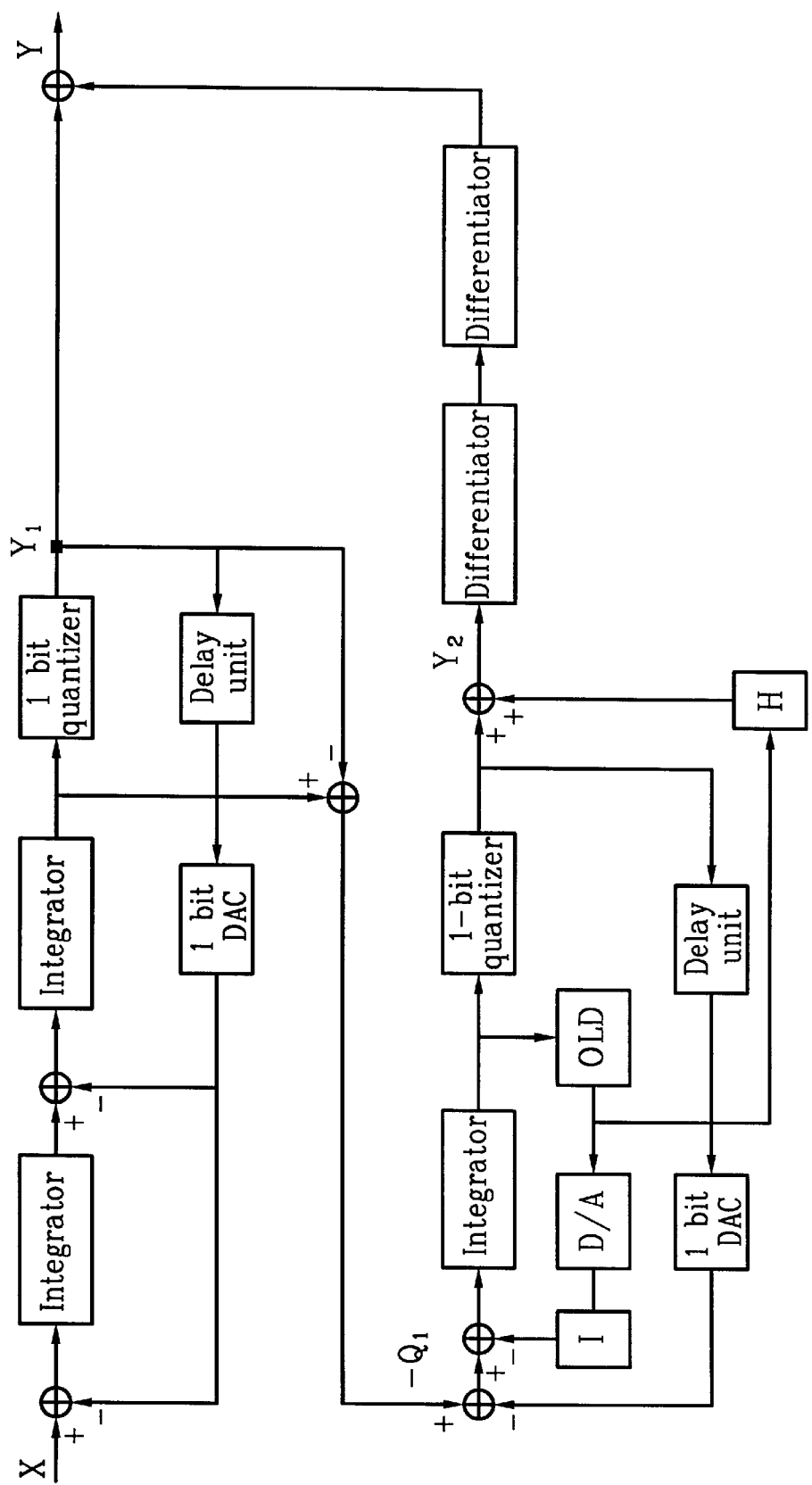
FIG. 14 illustrates the conventional architecture of an SOFOC by "internal linear feedback loop"

The "multi-bit quantization" technique of the prior art basically adopts a multi-bit quantizer for replacing the original single-bit quantizer in the SDM architecture, as shown in FIG. 13. The "internal linear feedback loop" technique of prior art, as shown in FIG. 14, places an overload detector (OLD) at the output end of the integrators of the SDM for detecting whether integrators are overloaded, then further determines whether the local feedback loop is activated to attenuate the input signal swing in the integrator, or if the internal switch of the integrator is turned off to prevent instability due to excessive signal accumulation in the integrator.

The "multi-bit quantization" technique and "internal linear feedback loop" technique attempt to resolve overload problems. Although they desire to reduce the overload problem of the SDM as does the LNFL technique, the SNR of the overall system will not be reduced in the compensation. In addition, the control of the above two techniques of conventional art is based upon whether the signal magnitude at the input end of the quantizer of the SDM (that is, the output signal of the integrator) is overloaded.

In contrast, the principle of the LNFL technique of this invention takes the control of the signal magnitude at the input end of the SDM (that is, the input signal of the integrator) into consideration; therefore, maintaining the input signal of the integrator within a particular dynamic range, regardless of the overload at the input end of the integrator in the SDM. Therefore, the SDM employing the LNFL technique of this invention is less likely to be overloaded.

In the SOFOC architecture for example, the results of a comparative simulation of stability employing the LNFL (refer to FIG. 5) and multi-bit quantization (refer to FIG. 13) respectively are shown in FIG. 15.

FIG. 15 illustrates a comparison chart of the stability between the SOFOC by "multi-bit quantization" architecture (FIG. 13) and the SOFOC by the LNFL architecture of this invention (FIG. 5); where (A) and (B) show the simulated results of the SOFOC by the LNFL architecture; and (C) and (D) illustrate the simulated results of the multi-bit quantization.

Figure 15A:
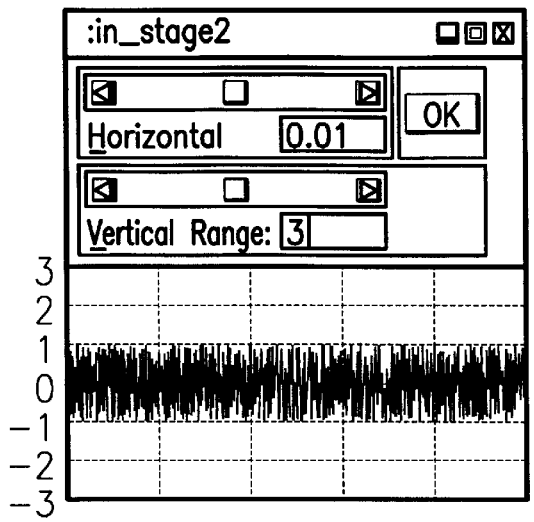
FIGS. 15A–15D illustrate a comparison chart of the stability between the SOFOC by the LNFL architecture.
Figure 15B:
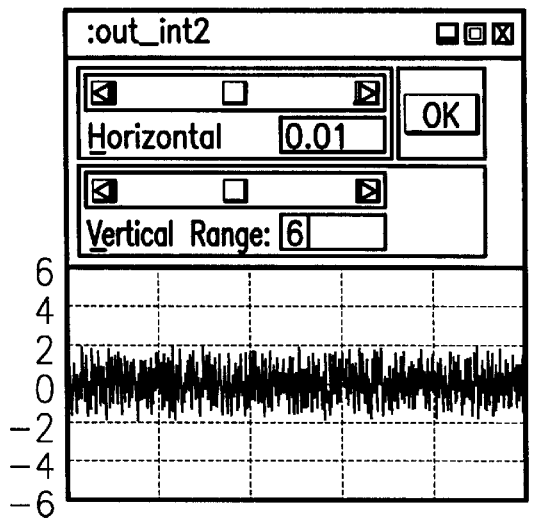
Figure 15C:
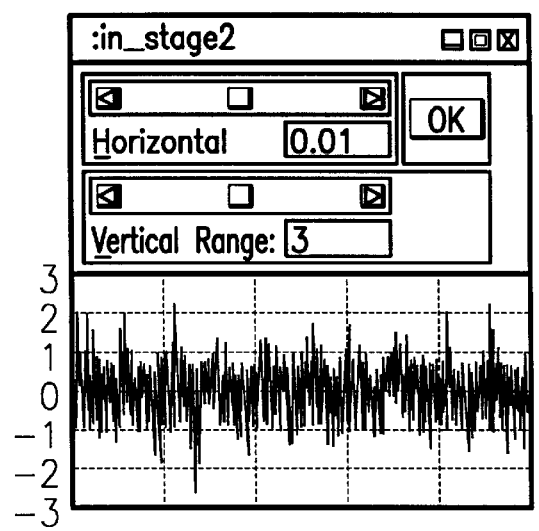

As can be seen from FIGS. 15(A) and 15(C), the SOFOC by the LNFL architecture restricts the quantized noise $-Q_1$ inputted to second-stage modulation unit within the range of $-1$ to $+1$ ($\Delta=2$) with the control of the level adjustment device VADJ; such processing is not done in the multi-bit quantization of the SOFOC architecture.

Figure 15D:
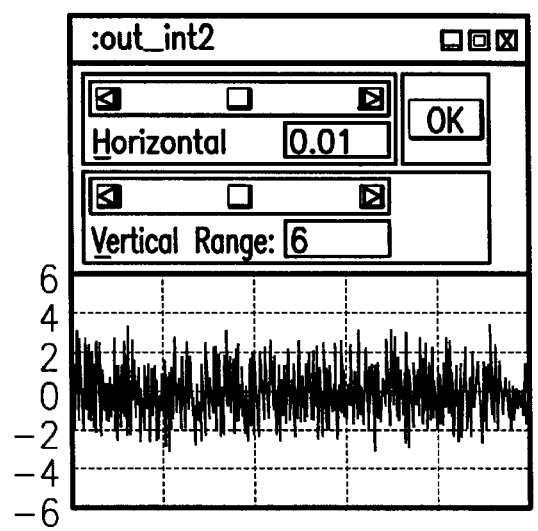

As can be seen from FIGS. 15(B) and 15(D), the dynamic range of the signal is significantly smaller in the SOFOC by the LNFL architecture of this invention than in the second-stage modulation unit of the SOFOC by multi-bit quantization architecture. Therefore, the SOFOC by the LNFL architecture is better than the SOFOC by multi-bit quantization architecture in terms of stability.

Figure 11:
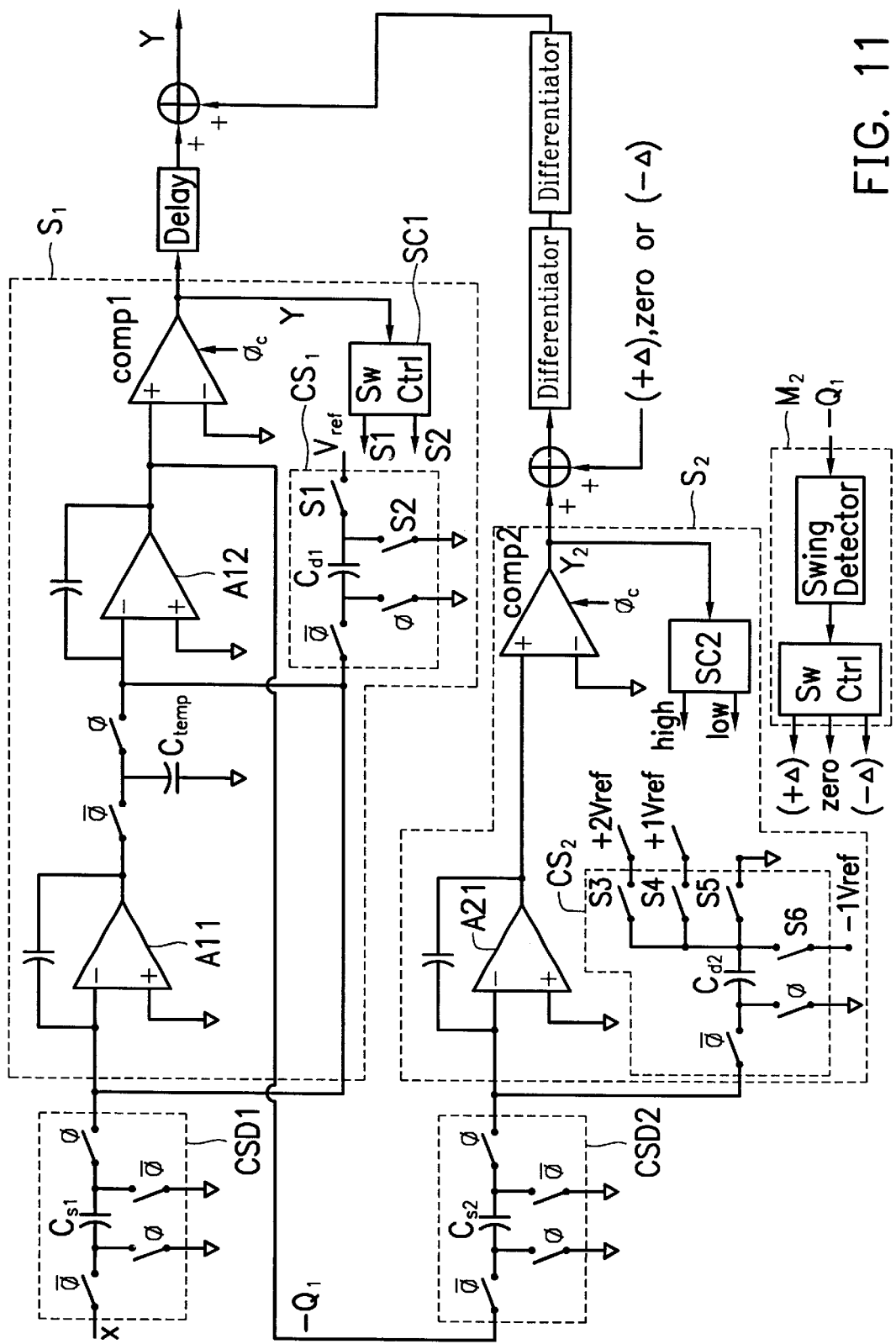
FIG. 11 illustrates a circuit diagram of an SDM applying SOFOC by the LNFL.

Referring to FIG. 11, the circuit configuration of the SOFOC by the LNFL of this invention comprises the following units:

(1) Plural modulation units $S_1$–$S_n$ connected in series for generating plural modulated signals $Y_1$–$Y_n$ and plural quantized error signals $-Q_1$–$-Q_n$. For convenience, only two modulation units ($S_1$, $S_2$) connected in series are shown in FIG. 11, wherein the input end of the modulation unit $S_1$ is coupled to the input of an analog signal X, and the input of the modulation unit $S_2$ is coupled to the quantized error signal $-Q_1$ outputted by the first modulation unit $S_1$, respectively.

(2) A level adjustment unit $M_2$ being selectively arranged at the input end of the modulation unit $S_2$.

(3) An adder-synthesizer unit, coupled to plural modulated signals $Y_1$-$Y_2$ of the two modulation units $S_1$-$S_2$, for generating an output signal Y of the SDM.

Herein, the modulation unit $S_1$ includes: a two-order integration module, formed by two sets of integrators A11 and A12) connected in series, for outputting the quantized error signal $-Q_1$; a quantizer, formed by a comparator comp1, for quantizing the quantized error signal $-Q_1$ and outputting the modulation signal $Y_1$; a feedback capacitor switch $CS_1$, formed with the switches S1, S2, $\phi$, $\bar{\phi}$ and a capacitor $C_{d1}$ as shown in FIG. 11, where its output is coupled to the input of the two-order integration module; and a switch control unit SC1 for controlling the conduction (on/off) of the switch S1 or S2 in accordance with the magnitude of the modulated signal $Y_1$, and for enabling the coupling of the voltage signal Vref or 0 to the input ends of each of the integrators A11 and A12 of the two-order integration module.

The modulation unit $S_2$ comprises a one-order integrator module, formed with an integrator A21, for outputting a quantized error signal $-Q_2$ (not shown); a quantizer, formed with a comparator comp2, for quantizing the quantized error signal $-Q_2$ and outputting the modulated signal $Y_2$; a feedback capacitor switch device $CS_2$, formed with switches S3, S4, S5, S6, $\phi$, $\bar{\phi}$ and a capacitor $C_{d2}$ as shown in FIG. 11, with its output coupled with the input of the one-order integrator module; and a switch control unit SC2.

When the output quantized error signal $-Q_1$ of the modulation unit $S_1$ is detected by the level adjustment device $M_2$ to be smaller than $-\frac{1}{2}$ and when the modulation signal $Y_1$ is at a low voltage level L, the level adjustment unit $M_2$, in conjunction with the switch control unit SC2, turns on the switch S3 for inputting the voltage signal 2Vref to the feedback capacitor switch device $CS_2$, thereby subtracting the specific amount $\Delta$ from the modulation signal $Y_2$ of the modulation unit $S_2$. In addition, when the output quantized error signal $-Q_1$ of the modulation unit $S_1$ is detected by the level adjustment device $M_2$ to be smaller than the first value $-\frac{1}{2}$, and when the modulation signal $Y_1$ is at a high voltage level H, the level adjustment unit $M_2$, in conjunction with the switch control unit SC2, turns on the switch S4 for outputting the voltage signal Vref to the feedback capacitor switch device $CS_2$, thereby substracting the specific amount $\Delta$ from the modulation signal $Y_2$ of the modulation unit $S_2$.

When the output quantized error signal $-Q_1$ of the modulation unit $S_1$ is detected by the level adjustment device $M_2$ to be greater than $\frac{1}{2}$, and when the modulation signal $Y_1$ is at the low voltage level L, the level adjustment unit $M_2$, in conjunction with switch control unit SC2, turns on the switch S5 for inputting the voltage signal 0 to the feedback capacitor switch device $CS_2$, thereby adding the specific amount $\Delta$ to the modulation signal $Y_2$ of the modulation unit $S_2$. In addition, when the output quantized error signal $-Q_1$ of the modulation unit $S_1$ is detected by the level adjustment device $M_2$ to be greater than $\frac{1}{2}$, and when the modulation signal $Y_1$ is at the high voltage level H, the level adjustment unit $M_2$, in conjunction with switch control unit SC2, turns on the switch S6 for inputting the voltage signal $-$Vref to the feedback capacitor switch device $CS_2$, thereby adding the specific amount $\Delta$ to the modulation signal $Y_2$ of the modulation unit $S_2$.

When the output quantized error signal $-Q_1$ of the modulation unit $S_1$ is detected by the level adjustment device $M_2$ to be between $\frac{1}{2}$ and $-\frac{1}{2}$, and when the modulation signal $Y_1$ is at the low voltage level L, the level adjustment unit $M_2$, in conjunction with switch control unit SC2, turns on the switch S4 for inputting the voltage signal Vref to the feedback capacitor switch device $CS_2$, thereby maintaining the modulation signal $Y_2$ of the modulation unit $S_2$ unchanged.

In addition, when the output quantized error signal $-Q_1$ of the modulation unit $S_1$ is detected by the level adjustment device $M_2$ to be between $\frac{1}{2}$ and $-\frac{1}{2}$, and when the modulation signal $Y_1$ is at the high voltage level H, the level adjustment unit $M_2$, in combination with switch control unit SC2, turns on the switch S5 for inputting the voltage signal 0 to the feedback capacitor switch device $CS_2$, thereby maintaining the modulation signal $Y_2$ of the modulation unit $S_2$ unchanged.

In the SOFOC SDM, the input end of the modulation unit $S_1$ is further coupled with a switch capacitor device CSD1, formed with four sets of switches (two pairs of $\phi$ and $\bar{\phi}$ each) and a capacitor $C_{S1}$; the input end of the modulation unit $S_2$ is also coupled with an electrical switch capacitor device CSD2, formed with four sets of switches (two pairs of $\phi$ and $\bar{\phi}$ each) and a capacitor $C_{S2}$, as shown in FIG. 11. In the SDM, a middle device formed with switches $\phi$, $\bar{\phi}$ and a capacitor $C_{temp}$ is coupled between the two integrators A11 and A12 of the two-order integration module. The switches $\phi$ and $\bar{\phi}$ are all periodically turned on alternately.

Figure 12:
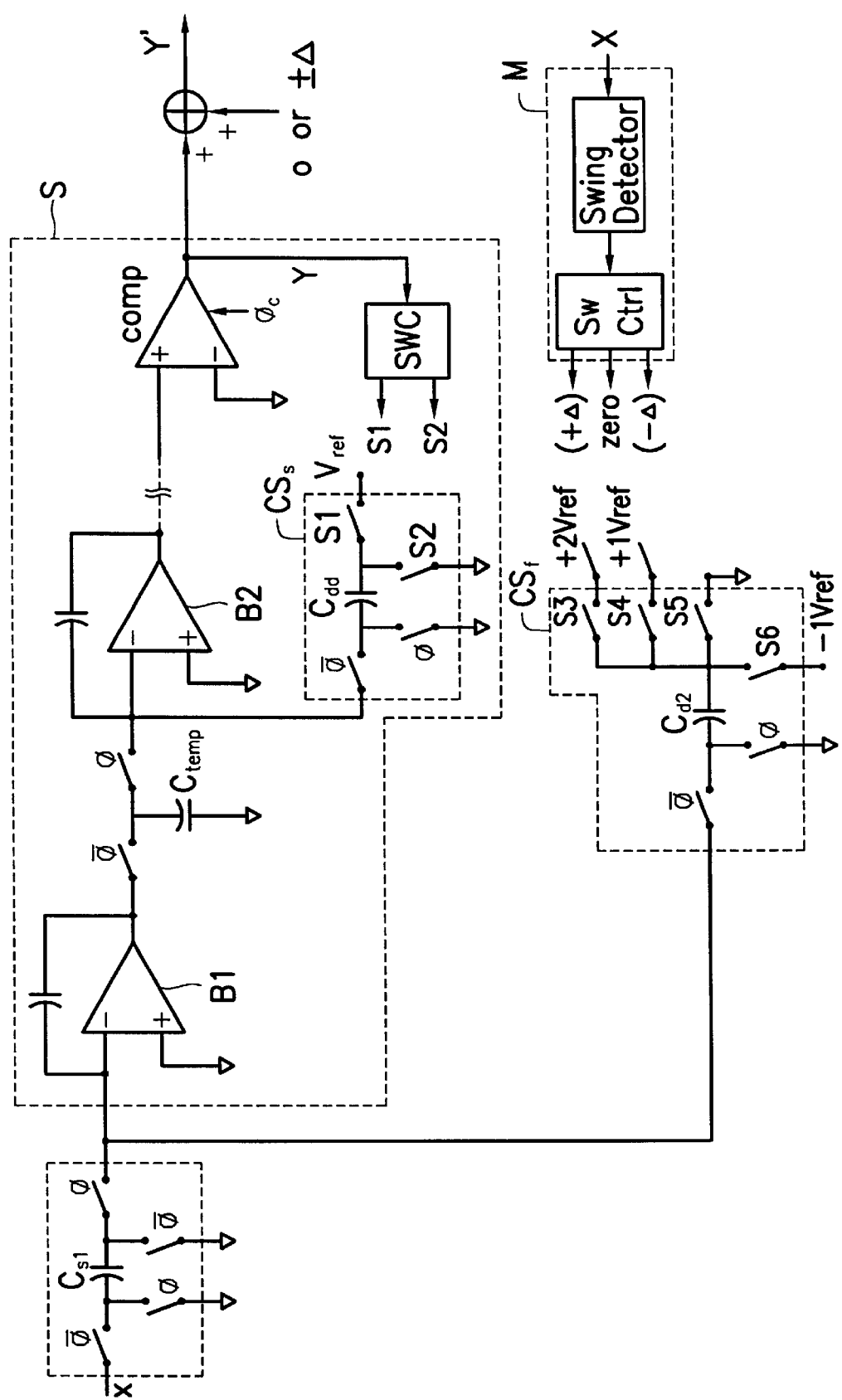
FIG. 12 illustrates a circuit diagram of a conventional SDM applying the "LNFL" technique.

The LNFL technique can also be applied to high-order SDM with classical architecture for improving stability; this invention also provides a classical SDM implemented in conjunction with the LNFL technique, with its circuit diagram being shown in FIG. 12. Referring to FIG. 12, the circuit configuration of the SDM with classical architecture comprises the following units:

(1) a modulation unit S, for generating a modulation signal Y and a quantized error signal $-Q$, respectively.

(2) a level adjustment unit M, for receiving an analog input signal X and selecting one signal from the voltage signals 2Vref, Vref, 0, and $-$Vref in accordance with the magnitude of the modulation signal Y to couple the selected signal to the input of the modulation unit S, and generating a compensation signal in accordance with the result.

(3) a synthesizer for receiving the modulation signal Y and the compensation signal and obtaining an output signal Y' for the SDM, wherein the level adjustment unit M outputs the compensation signal, when the signal magnitude equals a specific amount $\Delta$, $-\Delta$ or 0.

The modulation unit S comprises: a k-order integration module formed with plural integrators connected in series (however, for convenience, only two integrators B1, B2 are shown in FIG. 12); a quantizer, formed with a comparator comp, for coupling the output signal $-Q$ of the integration module, and quantizing and outputting the modulated signal Y; and a first feedback capacitor switch device $CS_f$, formed with switches S3, S4, S5, S6, $\phi$, $\bar{\phi}$ and a capacitor $C_d$, with its output coupled with the input of the k-order integration module, its input selecting one signal of the voltage signals 2Vref, Vref, 0, and $-$Vref through the level adjustment unit M.

The SDM further includes a switch control unit SWC, for selecting a voltage signal of Vref or 0 through a second feedback capacitor switch device, coupled with the input end of the second stage through the $k^{th}$-stage of the k integrators. A second capacitor switch device $CS_S$ is formed with switches S1, S2, $\phi$, $\bar{\phi}$ and a capacitor $C_{dd}$, as shown in FIG. 12.

The operation of switches S3, S4, S5 and S6 is specified as follows.

When the input signal X of the modulation unit S is detected by the level adjustment unit M to be smaller than $-\frac{\Delta}{2}$, and when the modulation signal Y is at the low voltage level L, the level adjustment unit M, in combination with switch control unit SWC, turns on the switch S3 for inputting the voltage signal 2Vref to the feedback capacitor switch device $CS_f$, thereby subtracting the specific amount $\Delta$ from the modulation signal Y of the modulation unit S. In addition, when the input signal X of the modulation unit S is detected by the level adjustment device M to be smaller than the first value $-\frac{\Delta}{2}$, and when the modulation signal Y is at the high voltage level H, the level adjustment unit M, in combination with switch control unit SWC, turns on the switch S4 for inputting the voltage signal Vref to the feedback capacitor switch device $CS_f$, thereby subtracting the specific amount $\Delta$ from the modulation signal Y of the modulation unit S.

When the input signal X of the modulation unit S is detected by the level adjustment device M to be greater than $\frac{\Delta}{2}$, and when the modulation signal Y is at the low voltage level L, the level adjustment unit M, in combination with switch control unit SWC, turns on the switch S5 for inputting the voltage signal 0 to the feedback capacitor switch device $CS_f$, thereby adding the specific amount $\Delta$ to the modulation signal Y of the modulation unit $S_2$, In addition, when the input signal X of the modulation unit S is detected by the level adjustment device M to be greater than $\frac{\Delta}{2}$, and when the modulation signal Y is at the high voltage level H, the level adjustment unit M, in combination with switch control unit SWC, turns on the switch S6 for inputting the voltage signal $-Vref$ to the feedback capacitor switch device $CS_f$, thereby adding the specific amount $\Delta$ to the modulation signal Y of the modulation unit S.

When the input signal X of the modulation unit S is detected by the level adjustment device M to be between $-\frac{\Delta}{2}$ and $\frac{\Delta}{2}$, and when the modulation signal $Y_1$ is at the low voltage level L, the level adjustment unit $M_2$, in combination with switch control unit SWC, turns on the switch S4 for inputting the voltage signal Vref to the feedback capacitor switch device $CS_f$, thereby maintaining the modulation signal $Y_2$ of the modulation unit $S_2$ unchanged. In addition, when the input signal X of the modulation unit S is detected by the level adjustment device M to be between $\frac{\Delta}{2}$ and $-\frac{\Delta}{2}$, and when the modulation signal Y is at the high voltage level H, the level adjustment unit M, in combination with switch control unit SWC, turns on the switch S5, for inputting the voltage signal 0 to the feedback capacitor switch device $CS_f$, thereby maintaining the modulation signal Y of the modulation unit S unchanged.

Also, when the modulation signal Y is at the high voltage level H, the switch S2 must be turned on, and when the modulation signal Y is at the high voltage level H, the switch S1 must be turned on. In the conventional SDM, the input end of the modulation unit S is coupled with an electrical switch capacitor device formed with four sets of switches (two pairs of $\phi$ and $\bar{\phi}$ each) and a capacitor $C_S$; the input end of the modulation unit S is also coupled with an electrical switch capacitor device formed with four sets of switches (two pairs of $\phi$ and $\bar{\phi}$ each) and a capacitor $C_{S3}$, as shown in FIG. 12. In the SDM, a middle device formed with switches $\phi$, $\bar{\phi}$ and a capacitor $C_{temp}$ is coupled between any two integrators of the k-order integration module. The switches $\phi$ and $\bar{\phi}$ are all periodically inter-conductive.

As can be seen from above, the LNFL technique can be applied to every stage of the classical SDMs or the cascaded SDMs. The extra cost of applying the LNFL technique in terms of hardware circuit configuration is limited to a level adjustment device (such as a multiplexer) selectively arranged at the input end of the modulation unit in the circuit framework.

The innovation of our circuit design using a level adjustment device lies in moving the operating framework of the voltage selector (or the multiplexer) to the feedback loop of the stage SDM for stabilization control; and the level adjustment device being formed with an extra digital switch control (Sw Ctrl), the swing detector, and the local feedback compensative loop, as shown in FIG. 11. Moreover, the principle of this new technique for improving levels of reference voltage by increasing the feedback capacitance ($C_{d2}$ of FIG. 11) can be achieved through switch capacitor $CS_2$. That is, the dynamic range of the SDM is restricted to prevent overload of later stages of the SDMs. The swing detector is for monitoring whether the dynamic range is exceeded ($|\frac{\Delta}{2}$, $\Delta$: a multiple of digital bit level); whereas the local feedback compensative loop uses compensative operations at the digital ends for preventing additional error in the previous variation; and the digital switch controller is for controlling the logical timing if the switch controller on the feedback loop.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A sigma-delta modulator (SDM) using a local nonlinear feedback loop (LNFL) technique comprising:

plural modulation units connected in series, for generating plural modulated signals and plural quantized error signals, wherein the input end of at least one of said modulation units is coupled to an analog input signal, and the input ends of other said modulation units are coupled to said quantized error signals, respectively;

a level adjustment unit selectively arranged at the input end of at least one of said other modulation units for determining whether an addition or subtraction of a specified value will be performed to at least one of said quantized error signals in accordance with a signal value of said at least one of said quantized error signals of at least one of said modulation units, and performing in accordance with said determined result a subtraction or an addition of said specified value from or to a modulated signal of at least one of said modulation units, wherein at least one level adjustment unit is arranged in said SDM; and an adder-synthesizer unit coupled to the plural modulation signals generated by said plural modulation units for generating an output signal of the SDM.

2. The SDM of claim 1, wherein each of said modulation units includes, a k-order integration module;

a quantizer for coupling the output signal of said k-order integration module, and quantizing and outputting at least one of said plural modulated signals;

a synthesis operator for obtaining the difference between the output signal of said SDM and at least one of said plural modulated signals as said at least one quantized error signal; and a delay unit connected in serial to a digital-to-analog converter (DAC) for forming a feedback loop path to feedback one of said modulated signals to said k-order integration module.

3. The SDM of claim 2, wherein, said k-order integration module includes a plurality of integration units connected in series, each of said integration units comprising a synthesizer connected in serial to an integrator, and at least one of said modulated signals being fed back and coupled to each synthesizer of said k-order integration modules.

4. The SDM of claim 2, wherein said k-order integration module includes a synthesizer connected in serial to an integrator, and said at least one of said modulation signals being fed back and coupled to said synthesizer.

5. The SDM of claim 2, wherein said level adjustment unit determines whether a specified quantity is added to or subtracted from said at least one quantized error signal in accordance with the signal magnitude of the at least one quantized error signal outputted from at least one of said the modulation units by coupling said specified quantity of said signal magnitude to the synthesis operator of at least one of said modulation units.

6. The SDM of claim 2, wherein said quantizer is a one-bit quantizer and said DAC is a one-bit DAC.

7. The SDM of claim 2, wherein at least one of the plural modulated signals generated by said modulation units are first processed by differentiators, and then coupled to said adder-synthesizer.

8. A sigma-delta modulator (SDM) using local nonlinear feedback loop (LNFL) comprising:

a modulation unit for generating a modulated signal and a quantized error signal, respectively;

a level adjustment unit for receiving an analog input signal and determining whether an addition or subtraction of a specified value will be performed to said analog input signal in accordance with the magnitude of said analog input signal, thereby limiting the range of said analog input signal, and outputting the obtained result to said modulation unit; and a synthesizer unit for receiving said modulated signal and a compensation signal to obtain an output signal of the SDM, wherein said compensation signal is outputted by the level adjustment unit when the signal magnitude of said compensative signal equals said specified value.

9. The SDM of claim 8, wherein said modulation unit includes, a k-order integration module;

a quantizer for coupling the output signal of said integration module, said quantizer quantizing and outputting said modulated signal; and a delay unit connected in serial to a digital-to-analog converter (DAC) for forming a feedback path to feedback said modulated signal to said integration module.

10. The SDM of claim 9, wherein said k-order integration module includes a plurality of integration units connected in series, each of said plurality of integration units comprising a synthesizer connected in serial to an integrator, said modulation signal being fed back and coupled to each synthesizer of said plurality of integration units.

11. The SDM of claim 9, wherein said k-order integration module includes a synthesizer connected in serial to an integrator, said modulation signal being fed back and coupled to said synthesizer.

12. The SDM of claim 9, wherein said quantizer is a one-bit quantizer, while said DAC is a one-bit DAC.

13. A local nonlinear feedback loop (LNFL) method for use in a sigma-delta modulator (SDM), the method comprising the steps of:

selectively arranging input-signal adjustment devices in front of respective input ends of various stage integrator modulation units, for controlling a magnitude of an input signal of said various stage integrator modulation units, respectively;

subtracting a second specified value from said input signal by means of a corresponding input signal adjustment device, then outputting a value obtained from the subtraction to at least one of said various stage integrator modulation units, and further adding said second specified value to the output signal of at least one of said various stage integrator modulation units when the input signal of at least one of said various stage integrator modulation units is greater than a first specified value;

adding said second specified value to said input signal by means of an input signal adjustment device, then outputting it to at least one of said various stage integrator modulation units, and subtracting said second specified value from an output signal of at least one of said various stage integrator modulation units when the input signal of said coupled integrator modulation units is smaller than said first specified value.

14. The method of claim 13, wherein the input signals of said various stage of integrator modulation units are quantized error signals outputted by a preceding various stage integrator modulation unit.

15. A sigma-delta modulator (SDM) using a local non-linear feedback loop (LNFL) comprising:

plural modulation units connected in series $S_1$–$S_n$, for generating plural modulated signals $Y_1$–$Y_n$ and plural quantized error signals $-Q_1$--$Q_n$, wherein the input end of a modulation unit $S_j$ is coupled to an analog signal X input, and input ends of other said modulation units $S_2$–$S_n$ are coupled to said quantized error signals $Q_1$--$Q_{n-1}$, respectively;

a level adjustment unit $M_j$ selectively arranged at an input end of a modulation unit $S_{j+1}$ for selecting a level signal from at least one of level signals 2Vref, Vref, 0, –Vref and coupling the selected level signal to the input end of said modulation unit $S_{j+1}$ in accordance with a signal value of a quantized error signal $-Q_j$ of a modulation unit $S_j$, and for subtracting or adding in accordance with the selected level signal a specified value Δ from to a modulated signal $Y_{j+1}$ of said modulation unit $S_{j+1}$, where $1 \leq j \leq n-1$ and at least one of said level adjustment units is arranged in said SDM; and an adder-synthesizer unit coupled to the plural modulation signals $Y_1$–$Y_n$ generated by said plural modulation units $S_1$–$S_n$ for generating an output signal Y of the SDM.

16. The SDM of claim 15, wherein said modulation unit $S_j$ ($1 \leq j \leq n$) includes, a k-order integration module, outputting said error signal $-Q_j$;

a quantizer for coupling said error signal $-Q_j$ of said k-order integration module, and quantizing and outputting a modulated signal $Y_j$;

a feedback capacitor switch device $CS_a$, whose output end is coupled to the input end of said k-stage integrator modulation unit; and a switch control unit for selecting a voltage level signal of Vref and 0 through said feedback capacitor switch device when none of said level adjustment units $M_j$ are arranged in said modulation unit $S_j$, according to the value of said modulated signal $Y_j$, to couple with the input end of said k-stage integration module.

17. The SDM of claim 16, wherein, when k≧2, said k-order integration module comprises k integrator connected in series, and the output of said feedback capacitor switch device is coupled to each input end of said k integration units, respectively.

18. The SDM of claim 16, wherein, when k=1, said k-order integration module is an integrator, and the output of said feedback capacitor switch device is coupled to the input end of said integrator.

19. The SDM of claim 16, wherein, when the output quantized error signal $-Q_j$ of said modulation unit $S_j$ is smaller than a first value $-\Delta/2$, and when said modulation signal $Y_j$ is at a low voltage level, said level adjustment unit $M_j$ then selects to input the voltage signal 2Vref to said feedback capacitor switch device $CS_a$, and subtracts said specific amount $\Delta$ from the modulation signal $Y_{j+1}$ of said modulation unit $S_{j+1}$, and when the output quantized error signal $-Q_j$ of said modulation unit $S_j$ is smaller than said first value $-\Delta/2$, and when said modulation signal $Y_j$ is at a high voltage level, said level adjustment unit $M_j$ then selects to input the voltage signal Vref to said feedback capacitor switch device $CS_a$ and subtracts said specific amount $\Delta$ from the modulation signal $Y_{j+1}$ of said modulation unit $S_{j+1}$.

20. The SDM of claim 16, wherein, when the output quantized error signal $-Q_j$ of said modulation unit $S_j$ is greater than a second value $\Delta/2$, and when said modulation signal $Y_j$ is at a low voltage level, said level adjustment unit $M_j$ then selects to input the voltage signal 0 to said feedback capacitor switch device $CS_a$, and adds said specific amount $\Delta$ to the modulation signal $Y_{j+1}$ of said modulation unit $S_{j+1}$; and when the output quantized error signal $-Q_j$ of said modulation unit $S_{j+1}$ is greater than said second value $\Delta/2$, and said modulation signal $Y_j$ is at a high voltage level, said level adjustment unit $M_j$ then selects to input the voltage signal -Vref to said feedback capacitor switch device $CS_a$ and adds said specific amount $\Delta$ to the modulation signal $Y_{j+1}$ of said modulation unit $S_{j+1}$.

21. The SDM of claim 19, wherein, when the output quantized error signal $-Q_j$ of said modulation unit $S_j$ is between said first value and said second value, and when said modulation signal $Y_j$ is at the low voltage level, said level adjustment unit $M_j$ selects to input the voltage signal Vref to said feedback capacitor switch device $CS_a$, while maintaining the modulation signal $Y_j$ of said modulation unit $S_j$ unchanged; moreover, when the output quantized error signal $-Q_1$ of said modulation unit $S_j$ is between said first value and said second value, and when said modulation signal $Y_j$ is at the high voltage level, said level adjustment unit $M_j$ selects to input the voltage signal 0 to said feedback capacitor switch device $CS_a$ while maintaining the modulation signal $Y_{j+1}$ of said modulation unit $S_{j+1}$ unchanged.

22. The SDM of claim 21, wherein said feedback capacitor switch device $CS_a$ comprises: a first switch; a second switch; and a capacitor, wherein one end of said first switch is coupled with the input end of said modulation unit $S_j$, the other end of said first switch is coupled to one end of said second switch and one end of said capacitor, the other end of said second switch is coupled to ground, and the other end of said capacitor serves as the input end of said feedback capacitor device $CS_a$, whereby said first and second switches being turned on alternately.

23. The SDM of claim 22, wherein the input end of said modulation unit $S_j$ coupled with a switch capacitor device which includes a third switch connected in series to a fourth switch; a fifth switch connected in series to a sixth switch; and a capacitor connected in serial between a connecting point of said third and fourth switches and a connecting point of said fifth and sixth switches, wherein the other ends of said fourth and sixth switches are connected to ground, the other end of said fifth switch is coupled to the input end of said modulation unit $S_j$, the other end of said third switch is coupled to the quantized error signal $-Q_{n-1}$; said third and sixth switches and said fourth and fifth switches being turned on alternately.

24. The SDM of claims 17, wherein a middle device is coupled between each two of said integrators in said k-order integrator modules, which includes a seventh switch connected in series to an eighth switch arranged between said two integrators; and a capacitor, with its one end being coupled to the connecting point of said seventh and eighth switches and its other end coupled to ground, whereby said seventh and eighth switches being turned on alternately.

25. The SDM of claim 16, wherein said quantizer is a comparator.

26. The SDM of claim 16, wherein the plural modulated signals $Y_2-Y_n$ generated by said modulation units $S_2-S_n$ are processed sequentially by at least one differentiator, then coupled to said adder-synthesizer unit.

27. A sigma-delta modulator (SDM) using a local non-linear feedback loop (LNFL), comprising:
a modulation unit, for generating a modulation signal and a quantized error signal, respectively.
a level adjustment unit, for receiving an analog input signal and for selecting one of voltage signals 2Vref, Vref, 0, and -Vref, in accordance with the magnitudes of said modulation signal and said analog input signal, to couple with the input end of said modulation unit, and for generating a compensation signal in accordance with the selecting result;
a synthesis operator for receiving said modulation signal and said compensation signal and then obtaining an output signal of the SDM; wherein the level adjustment unit outputs said compensation signal, the magnitude of said compensation signal equaling a specific amount $\Delta$ or 0.

28. The SDM of claim 27, wherein said modulation unit includes,
a k-order integration module;
a quantizer for coupling the output signal of said integration module, and quantizing and outputting said modulated signal; and
a first feedback capacitor switch device, with its output end coupled with the input end of said k-order integration module, and its input end selectively coupled to one of the voltage signals 2Vref, Vref, 0, and -Vref through the control of said level adjustment unit.

29. The SDM of claim 28, wherein, when k≧2, said k-order integrator module is formed with k integrators coupled and interconnected in serial, and the output of said feedback capacitor switch device is coupled to the input end of the first stage of said k integrators.

30. The SDM of claim 28, wherein, when k=1, said k-order integrator module is an integrator, and the output of said first feedback capacitor switch device is coupled to the input end of said integrator.

31. The SDM of claim 28, wherein said quantizer is a comparator.

32. The SDM of claim 29, further comprises a switch control unit for selecting one of the voltage level signals Vref and 0 through a second feedback capacitor switch device to couple to the input ends of the second integrator to the k-th integrator in accordance with the magnitude of said modulated signal.

33. The SDM of claim 28, wherein said first feedback capacitor switch includes a first switch; a second switch; and a capacitor, wherein one end of said first switch is coupled with the input end of said modulation unit, and the other end of said first switch is coupled with one end of said second switch and one end of said capacitor, the other end of said second switch is coupled to ground, the other end of said capacitor serves as the input end of said first feedback capacitor device, whereby said first and second switches being turned on alternately.

34. The SDM of claim 28, wherein said second feedback capacitor switch includes a third switch; a fourth switch; and a capacitor, wherein one end of said third switch is coupled with the input end of said modulation unit, and the other end of said third switch is coupled with one end of said fourth switch and one end of said capacitor, the other end of said fourth switch is coupled to ground, the other end of said capacitor serves as the input end of said second feedback capacitor device; said third and fourth switches being turned on alternately.

35. The SDM of claim 28, wherein, when the input signal of said modulation unit is smaller than a first value $-\Delta/2$, and when said modulation signal is at a low voltage level, said level adjustment unit then selects to input the voltage signal 2Vref to said first feedback capacitor switch device and subtracts said specific amount $\Delta$ from the modulation signal of said modulation unit; and when the input signal of said modulation unit is smaller than said first value $-\Delta/2$, and said modulation signal is at a high voltage level, said level adjustment unit then selects to input the voltage signal Vref to said first feedback capacitor switch device and subtracts said specific amount $\Delta$ from the modulation signal of said modulation unit.

36. The SDM of claim 28, wherein, when the input signal of said modulation unit is greater than a second value $\Delta/2$, and when said modulation signal is at a low voltage level, said level adjustment unit then selects to input the voltage signal to said first feedback capacitor switch device, and adds said specific amount $\Delta$ to the modulation signal of said modulation unit; and when the input signal of said modulation unit is greater than said second value $\Delta/2$, and said modulation signal is at a high voltage level, said level adjustment unit then selects to input the voltage signal −Vref to said first feedback capacitor switch device and adds said specific amount to the modulation signal of said modulation unit.

37. The SDM of claims 35, wherein, when the input signal of said modulation unit is between said first value and said second value, and when said modulation signal is at the low voltage level, said level adjustment unit selects to input the voltage signal Vref to said first feedback capacitor switch device while maintaining the modulation signal of said modulation unit unchanged; and when the input signal of said modulation unit is between said first value and said second value, and when said modulation signal is at the high voltage level, said level adjustment unit selects to input the voltage signal to said first feedback capacitor switch device while maintaining the modulation signal of said modulation unit unchanged.

38. The SDM of claim 37, wherein, when said modulated signal is at the low voltage level, said switch control unit selects the voltage level signal Vref; and when said modulated signal is at the high voltage level, said switch control unit selects the voltage level signal 0.

39. The SDM of claim 38, wherein the input end of said modulation unit is further coupled with an switch capacitor device which includes a fifth switch connected in series to a sixth switch; a seventh switch connected in series to a eighth switch; and a capacitor connected in serial between the connecting point of said fifth and sixth switches and the connecting point of said seventh and eighth switches, the other end of said sixth and eighth switches is connected to ground, one end of said seventh switch is coupled to the input end of said modulation device, one end of said fifth switch is coupled to said analog input signal, whereby said fifth and eighth switches and said sixth and seventh switches being turned on alternately.

40. The SDM of claims 29, wherein a middle device is coupled between each two of said integrators in said k-order integrator modules, said middle device includes a ninth switch connected in series to a tenth switch formed between said two integrators; and a capacitor, with its one end being coupled to the connecting point of said ninth and tenth switches and its other end coupled to ground, whereby said ninth and tenth switches being turned on alternately.

* * * * *